(12) United States Patent
Lee

(10) Patent No.: US 8,115,315 B2
(45) Date of Patent: Feb. 14, 2012

(54) SEMICONDUCTOR CHIPS HAVING REDISTRIBUTED POWER/GROUND LINES DIRECTLY CONNECTED TO POWER/GROUND LINES OF INTERNAL CIRCUITS AND METHODS OF FABRICATING THE SAME

(75) Inventor: Jong-Joo Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 268 days.

(21) Appl. No.: 12/431,956

(22) Filed: Apr. 29, 2009

(65) Prior Publication Data

US 2009/0212414 A1 Aug. 27, 2009

Related U.S. Application Data

(62) Division of application No. 11/378,899, filed on Mar. 17, 2006, now Pat. No. 7,545,037.

(30) Foreign Application Priority Data

Mar. 18, 2005 (KR) .............................. 2005-002787

(51) Int. Cl.
*H01L 23/48* (2006.01)
(52) U.S. Cl. ......................... 257/773; 257/734; 257/786
(58) Field of Classification Search .................. 257/734, 257/773, 786
See application file for complete search history.

(56) References Cited

U.S. PATENT DOCUMENTS

| 6,211,576 B1 | 4/2001 | Shimizu et al. |
| 6,501,169 B1 | 12/2002 | Aoki et al. |
| 6,656,826 B2 | 12/2003 | Ishimaru |

FOREIGN PATENT DOCUMENTS

| JP | 2000-100814 | 4/2000 |
| JP | 2001-156209 | 6/2001 |
| JP | 2002-110799 | 4/2002 |
| JP | 2003-209181 | 7/2003 |
| KR | 2000-0023242 | 4/2000 |
| KR | 2001-0051937 | 6/2001 |
| KR | 2002-0025032 | 4/2002 |
| KR | 2003-0031254 | 4/2003 |
| KR | 2003-0041870 | 5/2003 |

*Primary Examiner* — Douglas Menz
(74) *Attorney, Agent, or Firm* — Volentine & Whitt, PLLC

(57) ABSTRACT

Provided are embodiments of semiconductor chips having a redistributed metal interconnection directly connected to power/ground lines of an internal circuit are provided. Embodiments of the semiconductor chips include an internal circuit formed on a semiconductor substrate. A chip pad is disposed on the semiconductor substrate. The chip pad is electrically connected to the internal circuit through an internal interconnection. A passivation layer is provided over the chip pad. A redistributed metal interconnection is provided on the passivation layer. The redistributed metal interconnection directly connects the internal interconnection to the chip pad through a via-hole and a chip pad opening, which penetrate at least the passivation layer. Methods of fabricating the semiconductor chip are also provided.

21 Claims, 19 Drawing Sheets

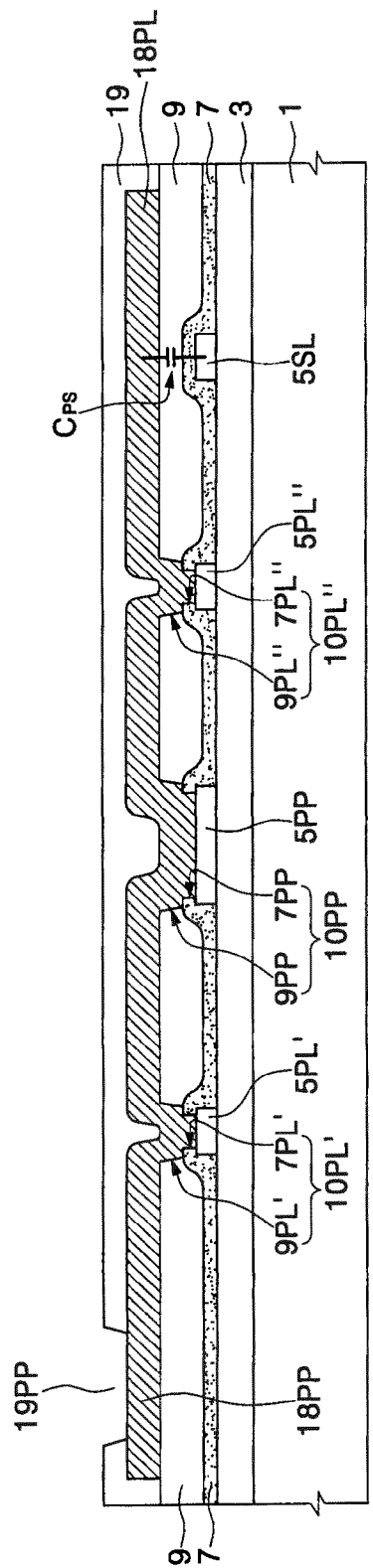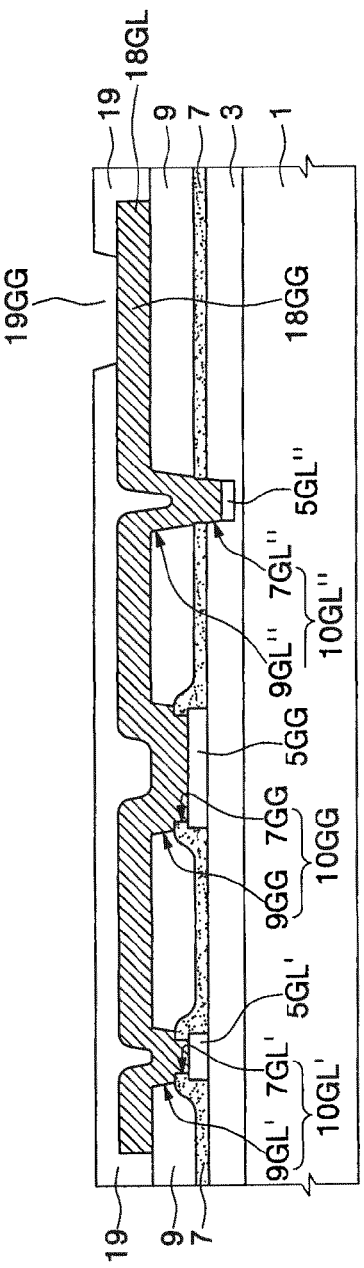

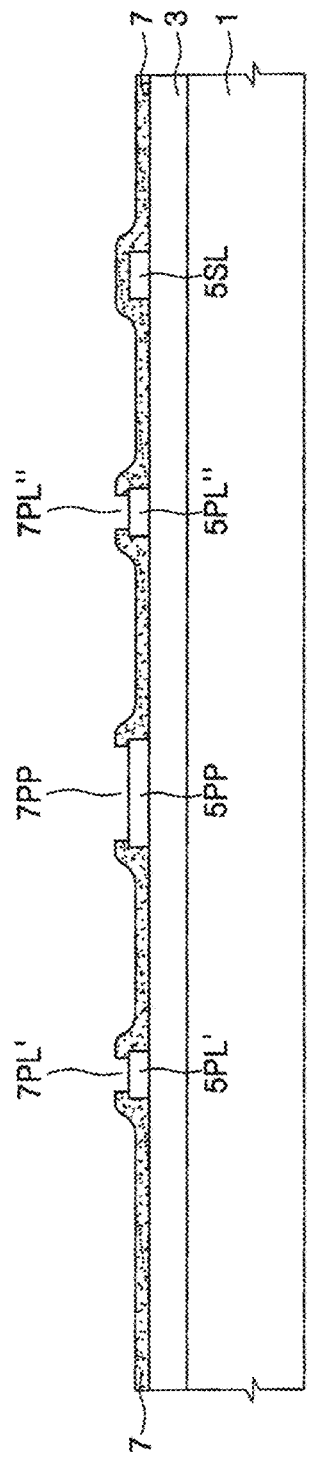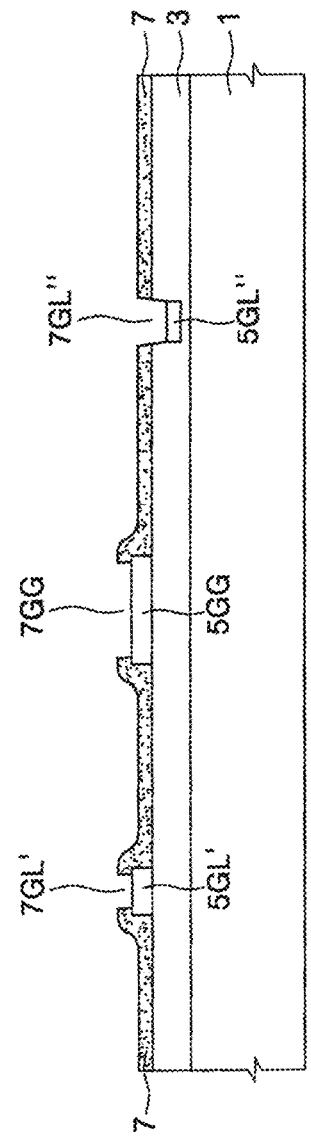

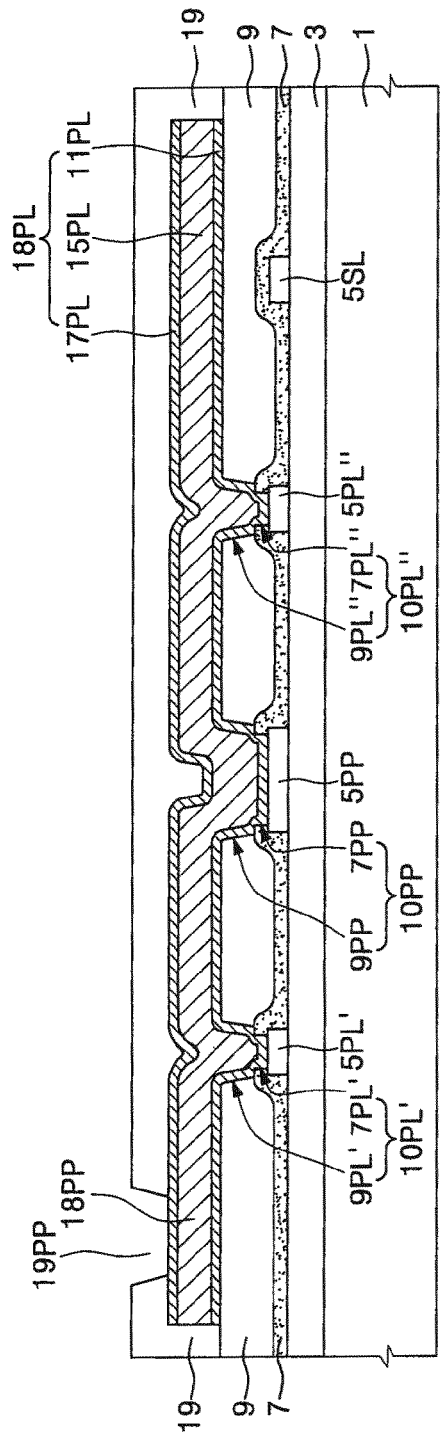
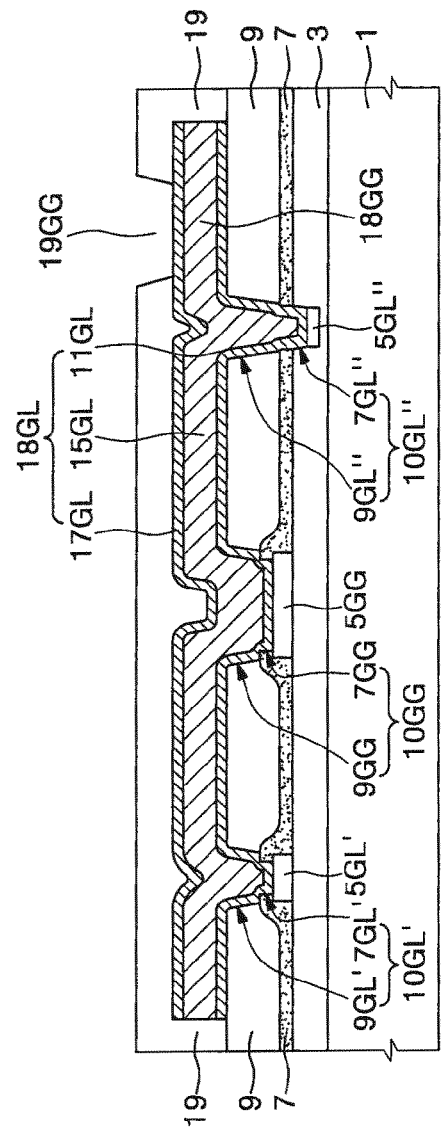

SEMICONDUCTOR CHIPS HAVING REDISTRIBUTED POWER/GROUND LINES DIRECTLY CONNECTED TO POWER/GROUND LINES OF INTERNAL CIRCUITS AND METHODS OF FABRICATING THE SAME

CROSS REFERENCE TO RELATED APPLICATION

This application is a Divisional of U.S. patent application Ser. No. 11/378,899, filed on Mar. 17, 2006, issued as U.S. Pat. No. 7,545,037 on Jun. 9, 2009, and which claims priority under 35 U.S.C. §119 Korean Patent Application No. 2005-0022787, filed Mar. 18, 2005, in the Korean Intellectual Property Office, the entire contents of which are hereby incorporated by reference.

FIELD OF THE INVENTION

The present invention relates to semiconductor chips and methods of fabricating the same and, more particularly, to semiconductor chips having redistributed power/ground lines directly connected to power/ground lines of internal circuits and methods of fabricating the same.

BACKGROUND OF THE INVENTION

As portable electronic devices become smaller, the dimensions of semiconductor chip packages must be reduced. In order to reduce the dimensions of the semiconductor chip packages, various packaging technologies have been developed. In addition, in order to implement high-performance requirements for the semiconductor chip packages, it may be required to form bonding pads in contact with solder balls or bonding wires at desired positions, regardless of the chip pad locations formed on a semiconductor chip. In this case, the bonding pads are electrically connected to the chip pads through redistributed metal interconnections.

A semiconductor chip having redistributed metal interconnections is disclosed in U.S. Pat. No. 6,211,576 B1 to Shimizu, et al., entitled "Semiconductor Device". According to Shimizu, et al., a power wiring section, a ground wiring section, and a signal wiring section are provided at the same level, and the power wiring section or the ground wiring section is formed adjacent to both sides of at least one portion of the signal wiring section.

SUMMARY

In one embodiment, the invention is directed to semiconductor chips having a redistributed metal interconnection. The semiconductor chips of this embodiment include an internal circuit and a chip pad formed on a semiconductor substrate. The chip pad is electrically connected to the internal circuit through an internal interconnection. A passivation layer is provided over the chip pad and the internal interconnection. A redistributed metal interconnection is provided on the passivation layer. The redistributed metal interconnection is directly connected to the internal interconnection and the chip pad through a via-hole and a chip pad opening, respectively, which penetrate the passivation layer.

BRIEF DESCRIPTION OF THE DRAWINGS

The foregoing and other objects, features, and advantages of the invention will be apparent from the detailed description of exemplary embodiments of the invention, as illustrated in the accompanying drawings. The drawings are not necessarily to scale, emphasis instead is placed upon illustrating the principles of the invention.

FIG. 2A is a cross-sectional view taken along line I-I' of FIG. 1.

FIG. 2B is a cross-sectional view taken along line II-II' of FIG. 1.

FIGS. 9A, 10A, and 11A are cross-sectional views taken along line I-I' of FIG. 1 to illustrate methods of fabricating a semiconductor chip in accordance with an embodiment of the present invention.

FIGS. 9B, 10B, and 11B are cross-sectional views taken along line II-II' of FIG. 1 to illustrate methods of fabricating a semiconductor chip in accordance with an embodiment of the present invention.

DETAILED DESCRIPTION

Figure 1:
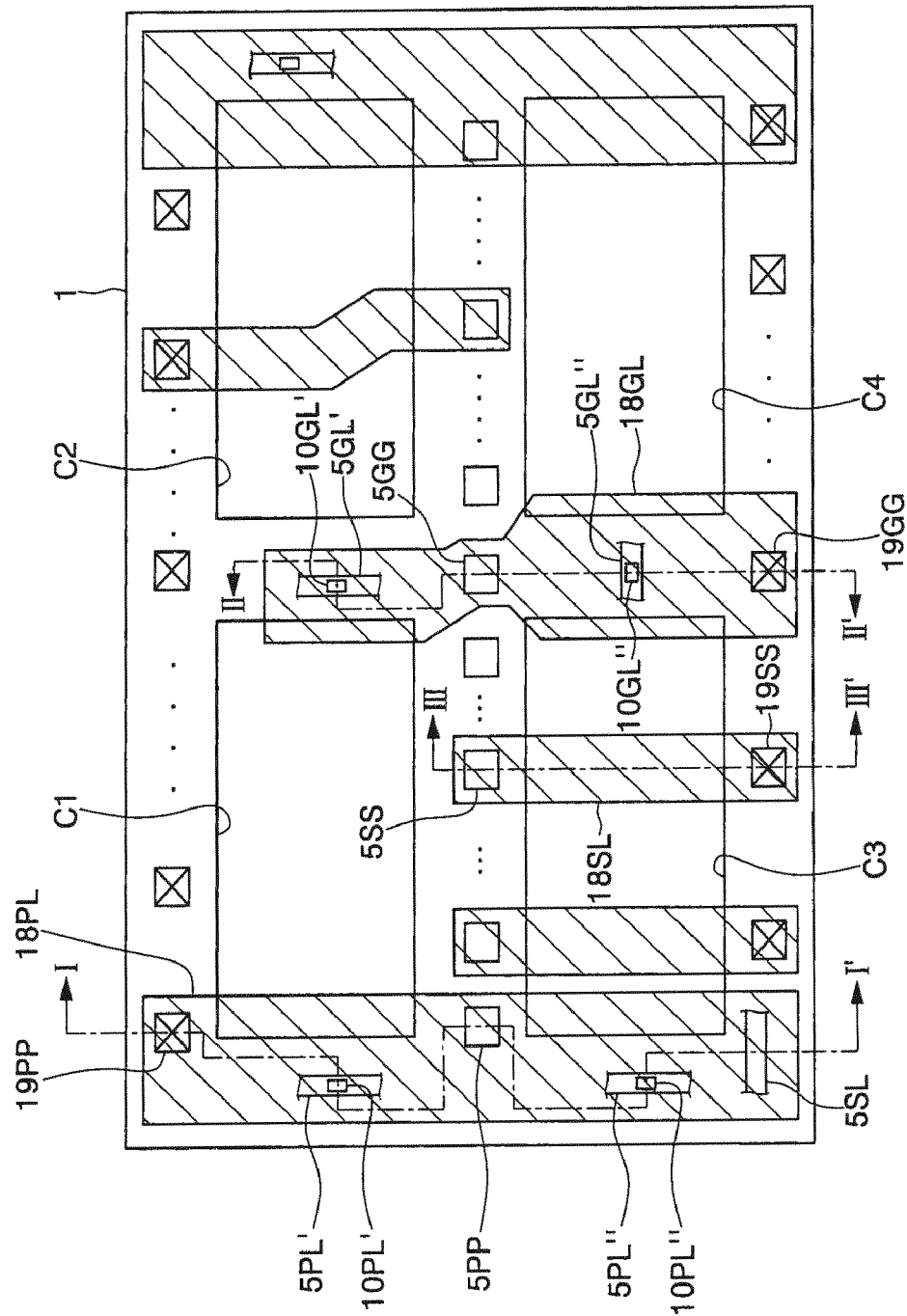
FIG. 1 is a plan view illustrating a semiconductor chip in accordance with an embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements throughout the specification.

Figure 2C:
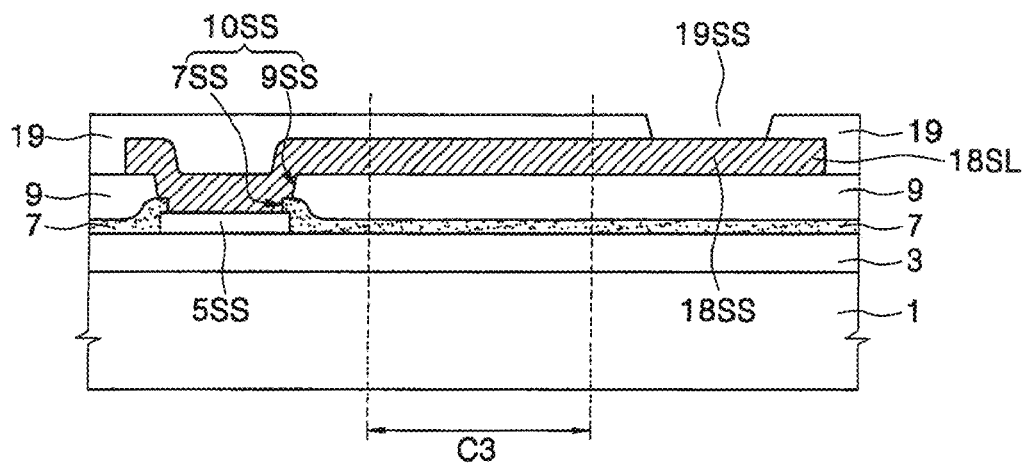
FIG. 2C is a cross-sectional view taken along line III-III' of FIG. 1.

FIG. 1 is a plan view of a semiconductor chip in accordance with an embodiment of the present invention, and FIGS. 2A, 2B, and 2C are cross-sectional views taken along lines I-I', II-II', and III-III' of FIG. 1, respectively.

Referring to FIGS. 1, 2A, 2B, and 2C, an internal circuit (not shown) is provided on a semiconductor substrate 1. The internal circuit may be memory cells and/or a peripheral circuit of a semiconductor memory device. For example, the internal circuit may be DRAM cells and/or a peripheral circuit for driving the DRAM cells. In this case, the DRAM cells may be disposed in a plurality of cell array regions, i.e., first to fourth cell array regions C1, C2, C3 and C4. However, the present invention is not limited to DRAM devices, but may be applicable to various other semiconductor devices. For example, the cell array regions C1, C2, C3, and C4 may be SRAM cell array regions or flash memory cell array regions. In addition, the present invention may also be applicable to a non-memory semiconductor device.

An interlayer insulating layer 3 is provided on the substrate 1 having the internal circuit. At least one internal interconnection and at least one chip pad are disposed on the interlayer insulating layer 3. The chip pad may be electrically connected to the internal circuit, through the internal interconnection. The internal interconnection may include first and second internal power lines 5PL' and 5PL", which supply a power voltage to the internal circuit as well as first and second internal ground lines 5GL' and 5GL", which supply a ground voltage to the internal circuit. In this case, the chip pad may include a power chip pad 5PP and a ground chip pad 5GG. The power chip pad 5PP is electrically connected to a power supply terminal of the internal circuit through the first and second internal power lines 5PL' and 5PL", and the ground chip pad 5GG is electrically connected to a ground supply terminal of the internal circuit through the first and second internal ground lines 5GL' and 5GL". In addition, the internal interconnection may further include an internal signal line 5SL electrically connected to an input or output terminal of the internal circuit. In this case, the chip pad may further include a signal chip pad 5SS electrically connected to the input or output terminal of the internal circuit through the internal signal line 5SL.

All the internal interconnections 5PL', 5PL", 5GL', 5GL", and 5SL may be disposed on the interlayer insulating layer 3. Alternatively, at least one of the internal interconnections 5PL', 5PL", 5GL', 5GL", and 5SL may be disposed in or under the interlayer insulating layer 3. For example, the second internal ground line 5GL" may be provided in the interlayer insulating layer 3 as shown in FIG. 2B. In other words, at least one of the internal interconnections 5PL', 5PL", 5GL', 5GL", and 5SL may be an interconnection formed of a different metal layer from the chip pads 5PP, 5GG, and 5SS.

A passivation layer 7 may be provided on the substrate 1 having the internal interconnections 5PL', 5PL", 5GL', 5GL", and 5SL and the chip pads 5PP, 5GG, and 5SS. The passivation layer 7 is a material layer for protecting the internal circuit from external moisture and physical impact. In general, the passivation layer 7 may include a silicon oxide layer and a silicon nitride layer, which are sequentially stacked. Predetermined regions of the internal power lines 5PL' and 5PL" and the first internal ground line 5GL' may be exposed through a first lower power via-hole 7PL', a second lower power via-hole 7PL", and a first lower ground via-hole 7GL', which penetrate the passivation layer 7, respectively. In addition, the power chip pad 5PP, the ground chip pad 5GG, and the signal chip pad 5SS may be exposed through a lower power chip pad opening 7PP, a lower ground chip pad opening 7GG, and a lower signal chip pad opening 7SS, which penetrate the passivation layer 7, respectively. Further, when any one of the internal interconnections, e.g., the second internal ground line 5GL" is disposed in the interlayer insulating layer 3 as described above, the second internal ground line 5GL" may be exposed through a second lower ground via-hole 7GL" which penetrates the passivation layer 7 and the interlayer insulating layer 3.

A first dielectric layer 9 is provided on the substrate 1 having the lower via-holes 7PL', 7PL", 7GL', and 7GL" and the lower chip pad openings 7PP, 7GG, and 7SS. The first dielectric layer 9 may be a polymer layer such as a polyimide layer or a photosensitive polyimide layer. Alternatively, the first dielectric layer 9 may be an oxide layer such as a silicon oxide layer. The internal power lines 5PL' and 5PL" and the internal ground lines 5GL' and 5GL" may be respectively exposed through first and second upper power via-holes 9PL' and 9PL" and first and second upper ground via-holes 9GL' and 9GL" which penetrate the first dielectric layer 9. Further, the power chip pad 5PP, the ground chip pad 5GG, and the signal chip pad 5SS may be respectively exposed through an upper power chip pad opening 9PP, an upper ground chip pad opening 9GG, and an upper signal chip pad opening 9SS which penetrate the first dielectric layer 9.

The first lower power via-hole 7PL' and the first upper power via-hole 9PL' constitute a first power via-hole 10PL', and the second lower power via-hole 7PL" and the second upper power via-hole 9PL" constitute a second power via-hole 10PL". In addition, the first lower ground via-hole 7GL' and the first upper ground via-hole 9GL' constitute a first ground via-hole 10GL', and the second lower ground via-hole 7GL" and the second upper ground via-hole 9GL" constitute a second ground via-hole 10GL". Further, the lower power chip pad opening 7PP and the upper power chip pad opening 9PP constitute a power chip pad opening 10PP, and the lower ground chip pad opening 7GG and the upper ground chip pad opening 9GG constitute a ground chip pad opening 10GG. Furthermore, the lower signal chip pad opening 7SS and the upper signal chip pad opening 9SS constitute a signal chip pad opening 10SS.

A redistributed metal interconnection is provided on the first dielectric layer 9. The redistributed metal interconnection may include a redistributed power line 18PL, a redistributed ground line 18GL, and a redistributed signal line 18SL. The redistributed power line 18PL directly connects the internal power lines 5PL' and 5PL" to the power chip pad 5PP through the first and second power via-holes 10PL' and 10PL" and the power chip pad opening 10PP, and the redistributed ground line 18GL directly connects the internal ground lines 5GL' and 5GL" to the ground chip pad 5GG through the first and second ground via-holes 10GL' and 10GL" and the ground chip pad opening 10GG. The redistributed signal line 18SL is electrically connected to the signal chip pad 5SS through the signal chip pad opening 10SS.

Consequently, the redistributed power line 18PL provides an additional power voltage supply path in addition to the internal power lines 5PL' and 5PL" supplying a power voltage to the internal circuit. Therefore, a stable power voltage can be supplied to the internal circuit due to the presence of the redistributed power line 18PL. In particular, the lower the electrical resistance of the redistributed power line 18PL is, the more stable the power voltage of the internal circuit is. Similarly, the redistributed ground line 18GL provides an additional ground voltage supply path in addition to the internal ground lines 5GL' and 5GL" supplying a ground voltage to the internal circuit. Therefore, a stable ground voltage can be supplied to the internal circuit due to the presence of the redistributed ground line 18GL. In particular, the lower the electrical resistance of the redistributed ground line 18GL is, the more stable the ground voltage of the internal circuit is.

Each of the redistributed power line 18PL, the redistributed ground line 18GL, and the redistributed signal line 18SL may include a copper layer having relatively low resistivity as compared to an aluminum layer and a tungsten layer. In other embodiments, each of the redistributed metal interconnections 18PL, 18GL, and 18SL may include a seed metal layer and a main metal layer, which are sequentially stacked. The main metal layer may include a copper layer. In detail, the main metal layer may include a copper layer, a diffusion barrier layer, and a gold layer, which are sequentially stacked. The gold layer is a metal layer for improving adhesion between the redistributed metal interconnections 18PL, 18GL, and 18SL and bonding wires contacting the redistributed metal interconnections 18PL, 18GL, and 18SL, and the diffusion barrier layer is a metal layer for suppressing interaction between the copper layer and the gold layer. In addition, the diffusion barrier layer may act as an oxidation stopping layer for preventing the copper layer from being oxidized when the copper layer is exposed to the air. The diffusion barrier layer may be, for example, a nickel layer.

When the main metal layer includes a copper layer, the seed metal layer may include a seed wetting layer and a seed copper layer, which are sequentially stacked. The seed wetting layer is a metal layer for improving adhesion of the seed copper layer. For example, the seed wetting layer may be a titanium layer or a chrome layer.

The redistributed metal interconnections 18PL, 18GL, and 18SL may have a plane shape as shown in FIG. 1 when viewed from a plan view. Alternatively, the redistributed metal interconnections 18PL, 18GL, and 18SL may have a mesh shape.

A portion of the internal signal line 5SL may overlap the redistributed power line 18PL and/or the redistributed ground line 18GL when viewed from a plan view. For example, the internal signal line 5SL may overlap the redistributed power line 18PL as shown in FIGS. 1 and 2A. In this case, parasitic capacitance Cps may exist between the internal signal line 5SL and the redistributed power line 18PL. The parasitic capacitance Cps may cause a time delay of a signal transmitted through the internal signal line 5SL. However, according to the embodiments, the parasitic capacitance Cps can be remarkably reduced since the first dielectric layer 9 is relatively thicker than the interlayer insulating layer 3. For example, when the first dielectric layer 9 is formed of a polymer layer and the interlayer insulating layer 3 is formed of a silicon oxide layer, the thickness of the first dielectric layer 9 ranges from about 2 μm to about 20 μm while the thickness of the interlayer insulating layer 3 ranges from about 0.3 μm to about 1.3 μm Therefore, the signal delay time due to the parasitic capacitance Cps is negligible.

The substrate 1 having the redistributed power line 18PL, the redistributed ground line 18GL, and the redistributed signal line 18SL may be covered with a second dielectric layer 19. The second dielectric layer 19 may be a polymer layer such as a polyimide layer or a photosensitive polyimide layer. Alternatively, the second dielectric layer 19 may be an oxide layer such as a silicon oxide layer. The redistributed power line 18PL may be exposed by at least one power bonding pad opening 19PP that penetrates the second dielectric layer 19, and the redistributed ground line 18GL may be exposed by at least one ground bonding pad opening 19GG that penetrates the second dielectric layer 19. In addition, the redistributed signal line 18SL may be exposed by at least one signal bonding pad opening 19SS that penetrates the second dielectric layer 19. As a result, the power bonding pad opening 19PP, the ground bonding pad opening 19GG, and the signal bonding pad opening 19SS define a power bonding pad 18PP, a ground bonding pad 18GG, and a signal bonding pad 18SS, respectively. The number of the signal bonding pads 19SS may be equal to the number of the signal chip pads 5SS. On the other hand, the number of the power bonding pad openings 19PP may be equal to or different from the number of the power chip pads 5PP, and the number of the ground bonding pad openings 19GG may be equal to or different from the number of the ground chip pads 5GG.

Bonding wires for conventional packaging may be bonded onto the bonding pads 18PP, 18GG, and 18SS. Alternatively, balls (or bumps) for wafer level packaging may be provided on the bonding pads 18PP, 18GG, and 18SS.

According to the above-described embodiments, the chip pads 5PP, 5GG, and 5SS are disposed on a straight line crossing the center of the semiconductor substrate 1, and the bonding pads 18PP, 18GG, and 18SS are disposed at edges of the semiconductor substrate 1. That is, the bonding pad openings 19PP, 19GG, and 19SS may be spaced apart from the chip pads 5PP, 5GG and 5SS, respectively, when viewed from a plan view. Therefore, in accordance with the above embodiments, center-type pads may be converted to edge-type pads as shown in FIG. 1. On the contrary, the chip pads 5PP, 5GG, and 5SS may be disposed at edges, i.e., along a periphery, of the semiconductor substrate 1, and the bonding pads 18PP, 18GG, and 18SS may be disposed on a straight line crossing the center of the semiconductor substrate 1. Accordingly, one skilled in the art will appreciate that edge-type pads may be converted to center-type pads.

In accordance with another embodiment of the present invention, the bonding pad openings 19PP, 19GG, and 19SS may overlap the chip pads 5PP, 5GG, and 5SS, respectively, when viewed from a plan view. In this case, when the chip pads 5PP, 5GG, and 5SS are center-type pads as shown in FIG. 1, the bonding pads 18PP, 18GG, and 18SS may also be center-type pads.

Figure 3:
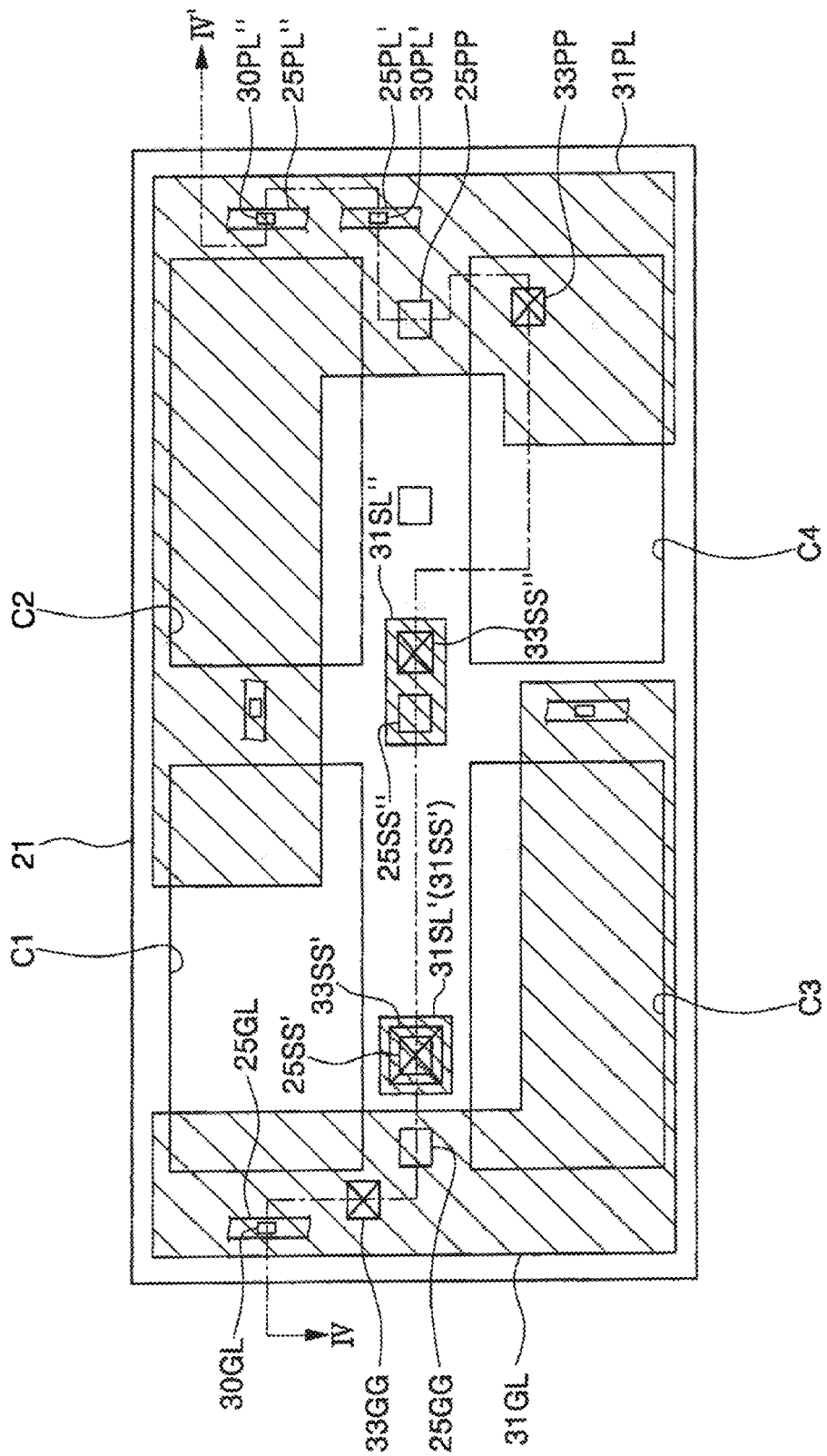
FIG. 3 is a plan view illustrating a semiconductor chip in accordance with another embodiment of the present invention.
Figure 4:
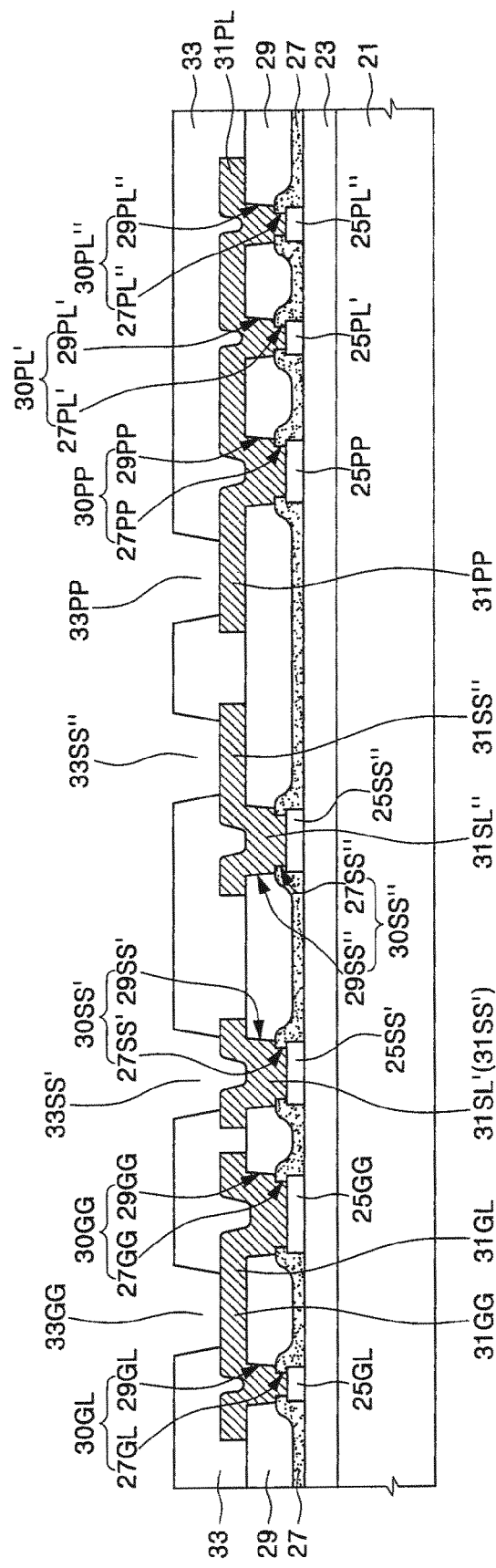
FIG. 4 is a cross-sectional view taken along line IV-IV' of FIG. 3.

FIG. 3 is a plan view of a semiconductor chip in accordance with yet another embodiment of the present invention, and FIG. 4 is a cross-sectional view taken along line IV-IV' of FIG. 3. Although the embodiment is described in conjunction with a semiconductor memory device having first to fourth cell array regions C1, C2, C3, and C4, it will be apparent to those skilled in the art that the present invention may be equally applicable to a non-memory semiconductor device. In addition, the embodiment is different from the embodiment described with reference to FIGS. 1, 2A, 2B, and 2C in terms of positions of the bonding pads. That is, center-type pads may be converted to random-type pads.

Referring to FIGS. 3 and 4, an interlayer insulating layer 23 is provided on a semiconductor substrate 21. A power chip pad 25PP, a ground chip pad 25GG and signal chip pads 25SS' and 25SS" as well as internal power lines 25PL' and 25PL", an internal ground line 25GL and at least one internal signal line (not shown) are provided on the interlayer insulating layer 23. However, at least one of the internal power lines 25PL' and 25PL", the internal ground line 25GL, and the internal signal line may be disposed in or under the interlayer insulating layer 23. That is, the chip pads 25PP, 25GG, 25SS', and 25SS" and the internal interconnections 25PL', 25PL", and 25GL may have the same or similar configuration and structure as the embodiments described with reference to FIGS. 1, 2A, 2B, and 2C. A passivation layer 27 is provided on the substrate 21 having the chip pads 25PP, 25GG, 25SS', and 25SS" and the internal interconnections 25PL', 25PL", and 25GL. The passivation layer 27 may be the same or similar material layer as the passivation layer 7 described with reference to FIGS. 2A, 2B, and 2C.

Like the embodiment described with reference to FIGS. 1, 2A, 2B, and 2C, the passivation layer 27 may have a lower power chip pad opening 27PP, a lower ground chip pad opening 27GG, a first lower signal chip pad opening 27SS', a second lower signal chip pad opening 27SS", a first lower power via-hole 27PL', a second lower power via-hole 27PL", and a lower ground via-hole 27GL, which expose the chip pads 25PP, 25GG, 25SS', and 25SS" and the internal interconnections 25PL', 25PL", and 25GL, respectively.

A first dielectric layer 29 is provided on the substrate 21 having the passivation layer 27. The first dielectric layer 29 may also be the same or similar material layer as the first dielectric layer 9 described with reference to FIGS. 2A, 2B, and 2C. The first dielectric layer 29 may have an upper power chip pad opening 29PP, an upper ground chip pad opening 29GG, a first upper signal chip pad opening 29SS', a second upper signal chip pad opening 29SS", a first upper power via-hole 29PL', a second upper power via-hole 29PL", and an upper ground via-hole 29GL, which expose the chip pads 25PP, 25GG, 25SS', and 25SS" and the internal interconnections 25PL', 25PL", and 25GL, respectively.

The lower power chip pad opening 27PP and the upper power chip pad opening 29PP constitute a power chip pad opening 30PP, and the lower ground chip pad opening 27GG and the upper ground chip pad opening 29GG constitute a ground chip pad opening 30GG. In addition, the first lower signal chip pad opening 27SS' and the first upper signal chip pad opening 29SS' constitute a first signal chip pad opening 30SS', and the second lower signal chip pad opening 27SS" and the second upper signal chip pad opening 29SS" constitute a second signal chip pad opening 30SS". Further, the first lower power via-hole 27PL' and the first upper power via-hole 29PL' constitute a first power via-hole 30PL', and the second lower power via-hole 27PL" and the second upper power via-hole 29PL" constitute a second power via-hole 30PL". Furthermore, the lower ground via-hole 27GL and the upper ground via-hole 29GL constitute a ground via-hole 30GL.

At least one redistributed metal interconnection is provided on the first dielectric layer 29. The redistributed metal interconnection may include a redistributed power line 31PL, a redistributed ground line 31GL, a first redistributed signal line 31SL' and a second redistributed signal line 31SL". The redistributed power line 31PL directly connects the internal power lines 25PL' and 25PL" to the power chip pad 25PP through the power via-holes 30PL' and 30PL" and the power chip pad opening 30PP, and the redistributed ground line 31GL directly connects the internal ground line 25GL to the ground chip pad 25GG through the ground via-hole 30GL and the ground chip pad opening 30GG. The first redistributed signal line 31SL' is electrically connected to the first signal chip pad 25SS' through the first signal chip pad opening 30SS', and the second redistributed signal line 31SL" is electrically connected to the second signal chip pad 25SS" through the second signal chip pad opening 30SS".

Consequently, the redistributed power line 31PL provides an additional power voltage supply path in addition to the internal power lines 25PL' and 25PL" supplying a power voltage to the internal circuit, and the redistributed ground line 31GL provides an additional ground voltage supply path in addition to the internal ground lines 25GL supplying a ground voltage to the internal circuit. Therefore, stable power and ground voltages can be supplied to the internal circuit due to the presence of the redistributed power line 31PL and the redistributed ground line 31GL.

The redistributed power line 31PL, the redistributed ground line 31GL, and the redistributed signal lines 31SL' and 31SL" may be the same material layer as the redistributed metal interconnections 18PL, 18GL, and 18SL described with reference to FIGS. 2A, 2B, and 2C. In addition, the redistributed power line 31PL, the redistributed ground line 31GL and the redistributed signal lines 31SL' and 31SL" may have the same configuration as the redistributed metal interconnections 18PL, 18GL, and 18SL described with reference to FIGS. 2A, 2B, and 2C. That is, the redistributed power line 31PL, the redistributed ground line 31GL and the redistributed signal lines 31SL' and 31SL" may have a plane shape or a mesh shape, when viewed from a plan view.

The substrate having the redistributed power line 31PL, the redistributed ground line 31GL and the redistributed signal lines 31SL' and 31SL" may be covered with a second dielectric layer 33. The second dielectric layer 33 may be a polymer layer such as a polyimide layer or a photosensitive polyimide layer. Alternatively, the second dielectric layer 33 may be a silicon oxide layer. The redistributed power line 31PL may be exposed by at least one power bonding pad opening 33PP that penetrates the second dielectric layer 33, and the redistributed ground line 31GL may be exposed by at least one ground bonding pad opening 33GG that penetrates the second dielectric layer 33. In addition, the redistributed signal lines 31SL' and 31SL" may be each exposed by first and second signal bonding pad openings 33SS' and 33SS" that penetrate the second dielectric layer 33. Consequently, the power bonding pad opening 33PP, the ground bonding pad opening 33GG, the first signal bonding pad opening 33SS', and the second signal bonding pad opening 33SS" define a power bonding pad 31PP, a ground bonding pad 31GG, a first signal bonding pad 31SS', and a second signal bonding pad 31SS", respectively. The number of the signal bonding pads 33SS' and 33SS" may be equal to the number of the signal chip pads 25SS' and 25SS". On the other hand, the number of the power bonding pad openings 33PP may be equal to or different from the number of the power chip pads 25PP, and the number of the ground bonding pad openings 33GG may be equal to or different from the number of the ground chip pads 25GG.

Bonding wires for conventional packaging may be bonded onto the bonding pads 31PP, 31GG, 31SS', and 31SS". Alternatively, balls for wafer level packaging may be located on the bonding pads 31PP, 31GG, 31SS', and 31SS".

In accordance with the above-described embodiments, the chip pads 25PP, 25GG, 25SS', and 25SS" are disposed on a straight line crossing the center of the semiconductor substrate 1, whereas the bonding pads 31PP, 31GG, 31SS', and 31SS" may be randomly disposed in the semiconductor substrate 1. That is, center-type pads may be converted to random-type pads as shown in FIG. 3. On the contrary, the chip pads 25PP, 25GG, 25SS', and 25SS" may be randomly disposed in the semiconductor substrate 1, and the bonding pads 31PP, 31GG, 31SS', and 31SS" may be disposed on a straight line crossing the center of the semiconductor substrate 1. In this case, it will be apparent to those skilled in the art that random-type pads may be converted to center-type pads.

In still other embodiments of the present invention, the chip pads 25PP, 25GG, 25SS', and 25SS" may be disposed at edges of the semiconductor substrate 1, and the bonding pads 31PP, 31GG, 31SS', and 31SS" may be randomly disposed in the semiconductor substrate 1. In this case, it will be apparent to those skilled in the art that edge-type pads may be converted to random-type pads. On the contrary, the chip pads 25PP, 25GG, 25SS', and 25SS" may be randomly disposed in the semiconductor substrate 1, and the bonding pads 31PP, 31GG, 31SS', and 31SS" may be disposed at edges of the semiconductor substrate 1. In this case, it will be apparent to those skilled in the art that random-type pads may be converted to edge-type pads.

Figure 5:
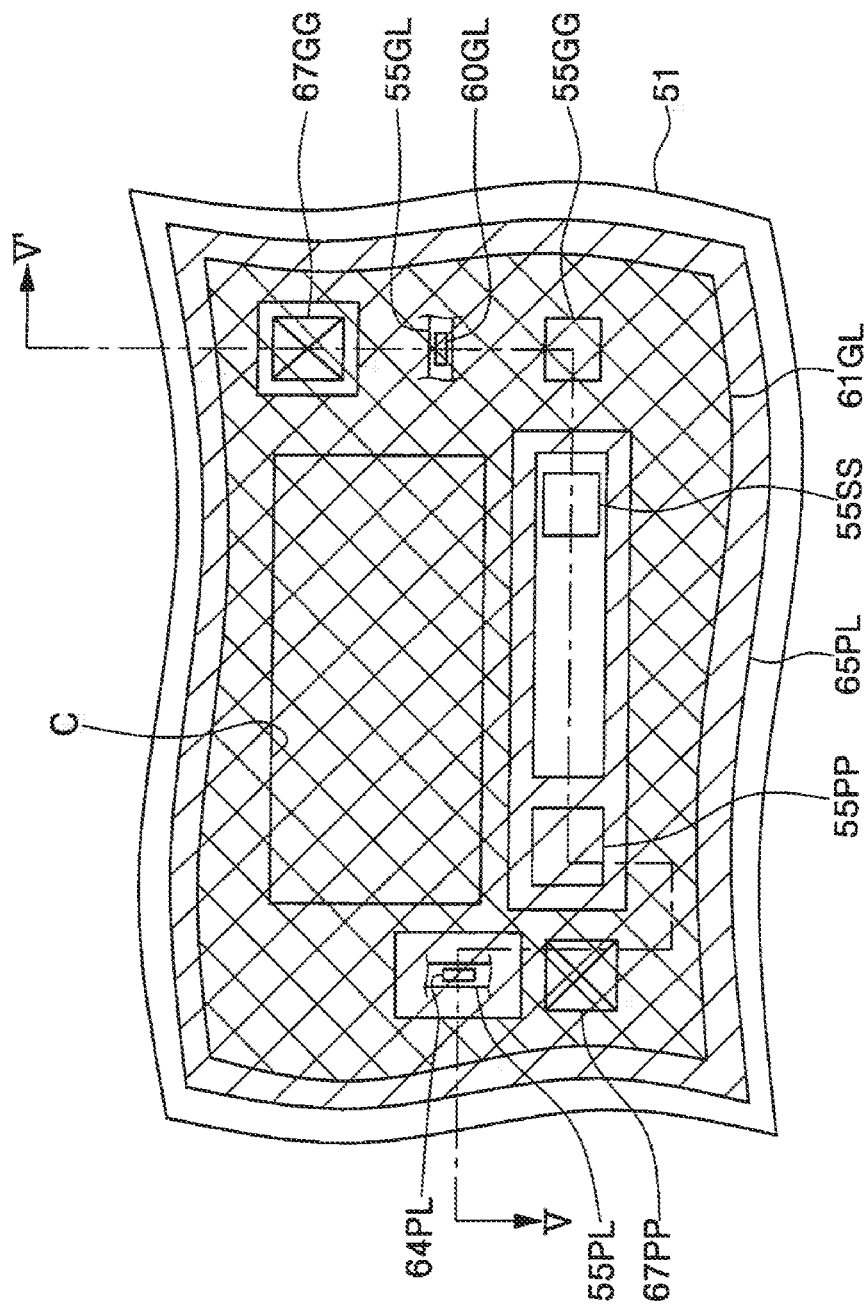
FIG. 5 is a plan view illustrating a semiconductor chip in accordance with still another embodiment of the present invention.
Figure 6:
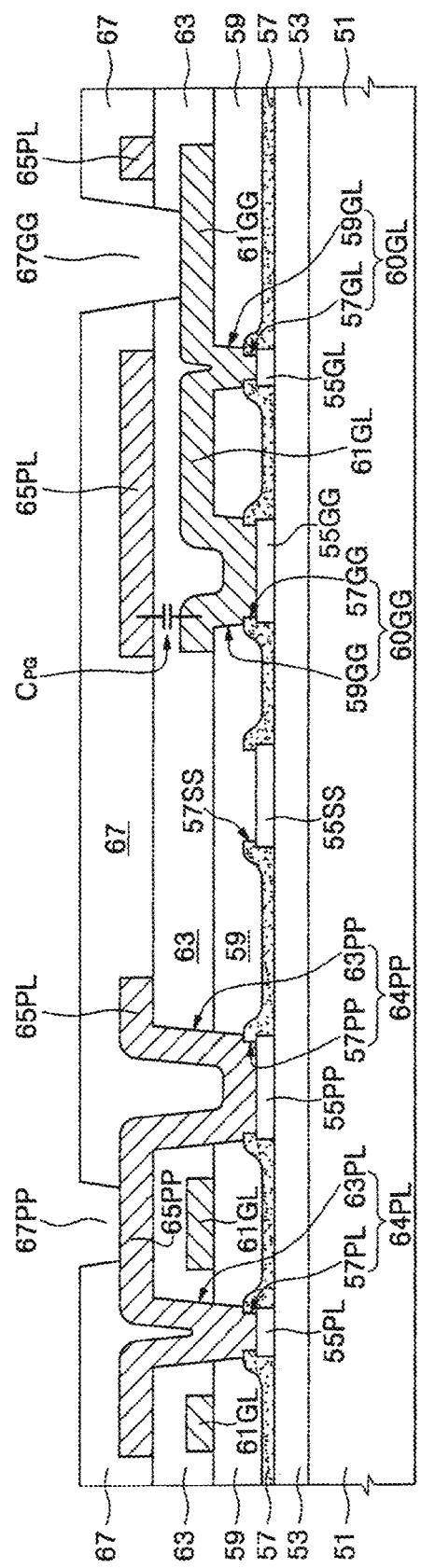
FIG. 6 is a cross-sectional view taken along line V-V' of FIG. 5.

FIG. 5 is a plan view of a semiconductor chip in accordance with yet another embodiment of the present invention, and FIG. 6 is a cross-sectional view taken along line V-V' of FIG. 5. Although the embodiment is described in conjunction with a semiconductor memory device having a cell array region C, it will be apparent to those skilled in the art that the present invention may be equally applicable to a non-memory semiconductor device.

Referring to FIGS. 5 and 6, an interlayer insulating layer 53 is provided on a semiconductor substrate 51. First and second power supply chip pads 55GG and 55PP, a signal chip pad 55SS, and first and second internal power supply lines 55GL and 55PL are provided on the interlayer insulating layer 53. In addition, at least one internal signal line (not shown) may be provided on the interlayer insulating layer 53. The first and second power supply chip pads 55GG and 55PP may be a ground chip pad and a power chip pad, respectively. In this case, the first and second internal power supply lines 55GL and 55PL correspond to an internal ground line and an internal power line, respectively. On the contrary, the first and second power supply chip pads 55GG and 55PP may be a power chip pad and a ground chip pad, respectively. In this case, the first and second internal power supply lines 55GL and 55PL correspond to an internal power line and an internal ground line, respectively.

In another embodiment of the present invention, at least one of the first and second internal power supply lines 55GL and 55PL and the internal signal line may be disposed in or under the interlayer insulating layer 53. That is, the internal power supply lines 55GL and 55PL and the internal signal line may have the same or similar configuration and structure as the embodiments described with reference to FIGS. 1, 2A, 2B, and 2C. A passivation layer 57 is provided on the substrate 51 having the chip pads 55GG, 55PP, and 55SS and the internal interconnections 55GL and 55PL. The passivation layer 57 may be the same or similar material layer as the passivation layer 7 described with reference to FIGS. 2A, 2B, and 2C.

Like the embodiments described with reference to FIGS. 1, 2A, 2B, and 2C, the passivation layer 57 has a first lower power supply chip pad opening 57GG, a second lower power supply chip pad opening 57PP, a lower signal chip pad opening 57SS, a first lower via-hole 57GL, and a second lower via-hole 57PL, which expose the chip pads 55GG, 55PP, and 55SS and the internal interconnections 55GL and 55PL, respectively.

A first lower dielectric layer 59 is provided on the substrate 51 having the passivation layer 57. The first lower dielectric layer 59 may also be the same or similar material layer as the first dielectric layer 9 described with reference to FIGS. 2A, 2B, and 2C. The first lower dielectric layer 59 has a first upper power supply chip pad opening 59GG and a first upper via-hole 59GL, which expose the first power supply chip pad 55GG and the first internal power supply line 55GL, respectively. The first lower power supply chip pad opening 57GG and the first upper power supply chip pad opening 59GG constitute a first power supply chip pad opening 60GG, and the first lower via-hole 57GL and the first upper via-hole 59GL constitute a first via-hole 60GL.

A first redistributed power supply line 61GL is provided on the first lower dielectric layer 59. The first redistributed power supply line 61GL directly connects the first internal power supply line 55GL to the first power supply chip pad 55GG through the first via-hole 60GL and the first power supply chip pad opening 60GG. The first redistributed power supply line 61GL may be the same or similar material layer as the redistributed metal interconnections 18PL, 18GL, and 18SL described with reference to FIGS. 2A, 2B, and 2C. In addition, the first redistributed power supply line 61GL may have the same or similar configuration as the redistributed metal interconnections 18PL, 18GL, and 18SL described with reference to FIGS. 2A, 2B, and 2C. That is, the first redistributed power supply line 61GL may have a plane shape or a mesh shape, when viewed from a plan view.

A first upper dielectric layer 63 is provided over the first redistributed power supply line 61GL. The first upper dielectric layer 63 may also be the same or similar material layer as the first dielectric layer 9 described with reference to FIGS. 2A, 2B, and 2C. The first upper/lower dielectric layers 63 and 59 have a second upper power supply chip pad opening 63PP and a second upper via-hole 63PL that expose the second power supply chip pad 55PP and the second internal power supply line 55PL, respectively. The second lower power supply chip pad opening 57PP and the second upper power supply chip pad opening 63PP constitute a second power supply chip pad opening 64PP, and the second lower via-hole 57PL and the second upper via-hole 63PL constitute a second via-hole 64PL.

A second redistributed power supply line 65PL is provided over the first upper dielectric layer 63. The second redistributed power supply line 65PL directly connects the second internal power supply line 55PL to the second power supply chip pad 55PP through the second via-hole 64PL and the second power supply chip pad opening 64PP. The second redistributed power supply line 65PL may be the same or similar material layer as the first redistributed power supply line 61GL. In addition, the second redistributed power supply line 65PL may have the same or similar configuration as the first redistributed power supply line 61GL. That is, the second redistributed power supply line 65PL may have a plane shape or a mesh shape, when viewed from a plan view.

When the first and second power supply chip pads 55GG and 55PP are a ground chip pad and a power chip pad respectively, the first and second redistributed power supply lines 61GL and 65PL correspond to a redistributed ground line and a redistributed power line respectively. On the contrary, when the first and second power supply chip pads 55GG and 55PP are a power chip pad and a ground chip pad respectively, the first and second redistributed power supply lines 61GL and 65PL correspond to a redistributed power line and a redistributed ground line, respectively.

In some embodiments, at least a portion of the first redistributed power supply line 61GL may overlap at least a portion of the second redistributed power supply line 65PL, as shown in the plan view of FIG. 5. In this case, power capacitance Cpg (see FIG. 6) may be provided between the first and second redistributed power supply lines 61GL and 65PL. The power capacitance Cpg can improve power noise immunity. Therefore, in order to increase the power noise immunity, it is preferable that the overlap area between the first and second redistributed power supply lines 61GL and 65PL be increased.

Consequently, it is possible to improve noise immunity and stability of the ground and power signals, which are applied to an internal circuit (i.e., memory cells in the cell array region C or peripheral circuits adjacent to the cell array region C).

The substrate 51 having the second redistributed power supply line 65PL may be covered with a second dielectric layer 67. The second dielectric layer 67 may be a polymer layer such as a polyimide layer or a photosensitive polyimide layer. Alternatively, the second dielectric layer 67 may be an oxide layer such as a silicon oxide layer. The first redistributed power supply line 61GL may be exposed by at least one first bonding pad opening 67GG that penetrates the second dielectric layer 67 and the first upper dielectric layer 63, and the second redistributed power supply line 65PL may be exposed by at least one second bonding pad opening 67PP that penetrates the second dielectric layer 67. That is, the first bonding pad opening 67GG defines a first bonding pad 61GG, and the second bonding pad opening 67PP defines a second bonding pad 65PP. The first and second bonding pads 61GG and 65PP may also be in direct contact with bonding wires or balls.

Although not shown in the FIGS. 5 and 6, the signal chip pad 55SS may be electrically connected to a redistributed signal line which is provided on the first lower dielectric layer 59 or the first upper dielectric layer 63, and the redistributed signal line may be exposed by a signal bonding pad opening, which penetrates the first upper dielectric layer 63 and the second dielectric layer 67 or penetrates only the second dielectric layer 67.

The bonding pad openings 67PP and 67GG may also overlap the chip pads 55PP and 55GG, respectively. Alternatively, the bonding pad openings 67PP and 67GG may be spaced apart from the chip pads 55PP and 55GG, when viewed from a plan view. That is, the embodiment may also provide semiconductor chips having various pad positions.

Figure 7A:
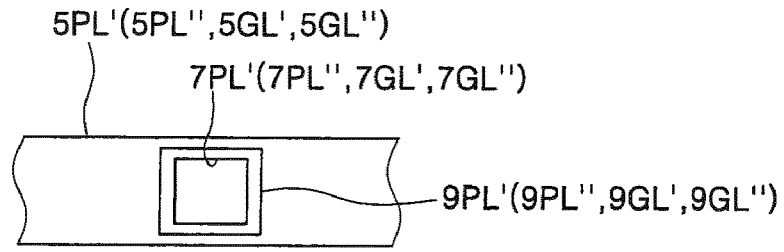
FIG. 7A is a plan view illustrating an exemplary shape of upper/lower internal power via-holes holes and upper/lower internal ground via-holes shown in FIGS. 1, 3, and 5.
Figure 7B:
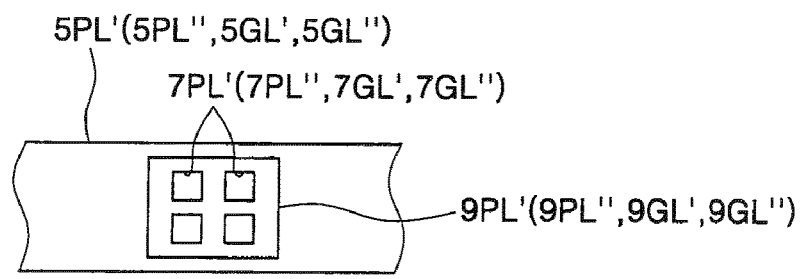
FIG. 7B is a plan view illustrating another exemplary shape of upper/lower internal power via-holes and upper/lower internal ground via-holes shown in FIGS. 1, 3, and 5.
Figure 7C:
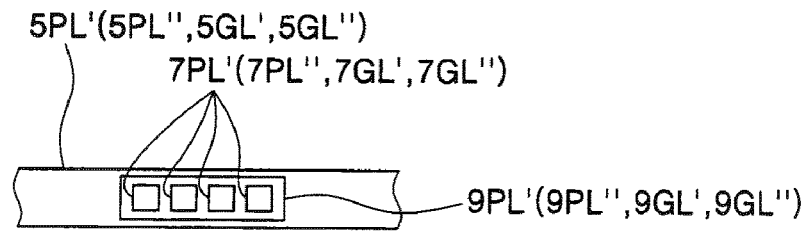
FIG. 7C is a plan view illustrating still another exemplary shape of upper/lower internal power via-holes and upper/lower internal ground via-holes shown in FIGS. 1, 3, and 5.

FIGS. 7A to 7C are plan views illustrating various configurations of the lower via-holes 7PL', 7PL", 7GL', and 7GL" and the upper via-holes 9PL', 9PL", 9GL', and 9GL" which expose the internal interconnections 5PL', 5PL", 5GL', and 5GL" shown in FIGS. 1, 2A, 2B, and 2C.

Referring to FIG. 7A, each of the lower via-holes 7PL', 7PL", 7GL', and 7GL" may have a single rectangular shape, and each of the upper via-holes 9PL', 9PL", 9GL', and 9GL" may also have a single rectangular shape. In this case, the upper via-holes 9PL', 9PL", 9GL', and 9GL" may be larger in size than the lower via-holes 7PL', 7PL", 7GL', and 7GL". Alternatively, each of the lower via-holes 7PL', 7PL", 7GL', and 7GL" may include a plurality of lower sub via-holes which are two-dimensionally arrayed as shown in FIG. 7B, and each of the upper via-holes 9PL', 9PL", 9GL', and 9GL" may have the same or similar configuration as shown in FIG. 7A. In this case, the upper via-holes 9PL', 9PL", 9GL', and 9GL" may have a sufficient width to overlap all of the lower sub via-holes.

When the internal interconnections 5PL', 5PL", 5GL', and 5GL" have smaller widths than those shown in FIGS. 7A and 7B, each of the lower via-holes 7PL', 7PL", 7GL', and 7GL" may include a plurality of lower sub via-holes which are one-dimensionally arrayed along a longitudinal direction of the internal interconnections 5PL', 5PL", 5GL', and 5GL" as shown in FIG. 7C. In this case, each of the upper via-holes 9PL', 9PL", 9GL', and 9GL" may have a rectangular shape to fully overlap the lower sub via-holes.

It will be apparent to those skilled in the art that the lower via-holes 7PL', 7PL", 7GL', and 7GL" and the upper via-holes 9PL', 9PL", 9GL', and 9GL" shown in FIGS. 7A, 7B, and 7C may also be applicable to the embodiments shown in FIGS. 3 to 6.

Figure 8:
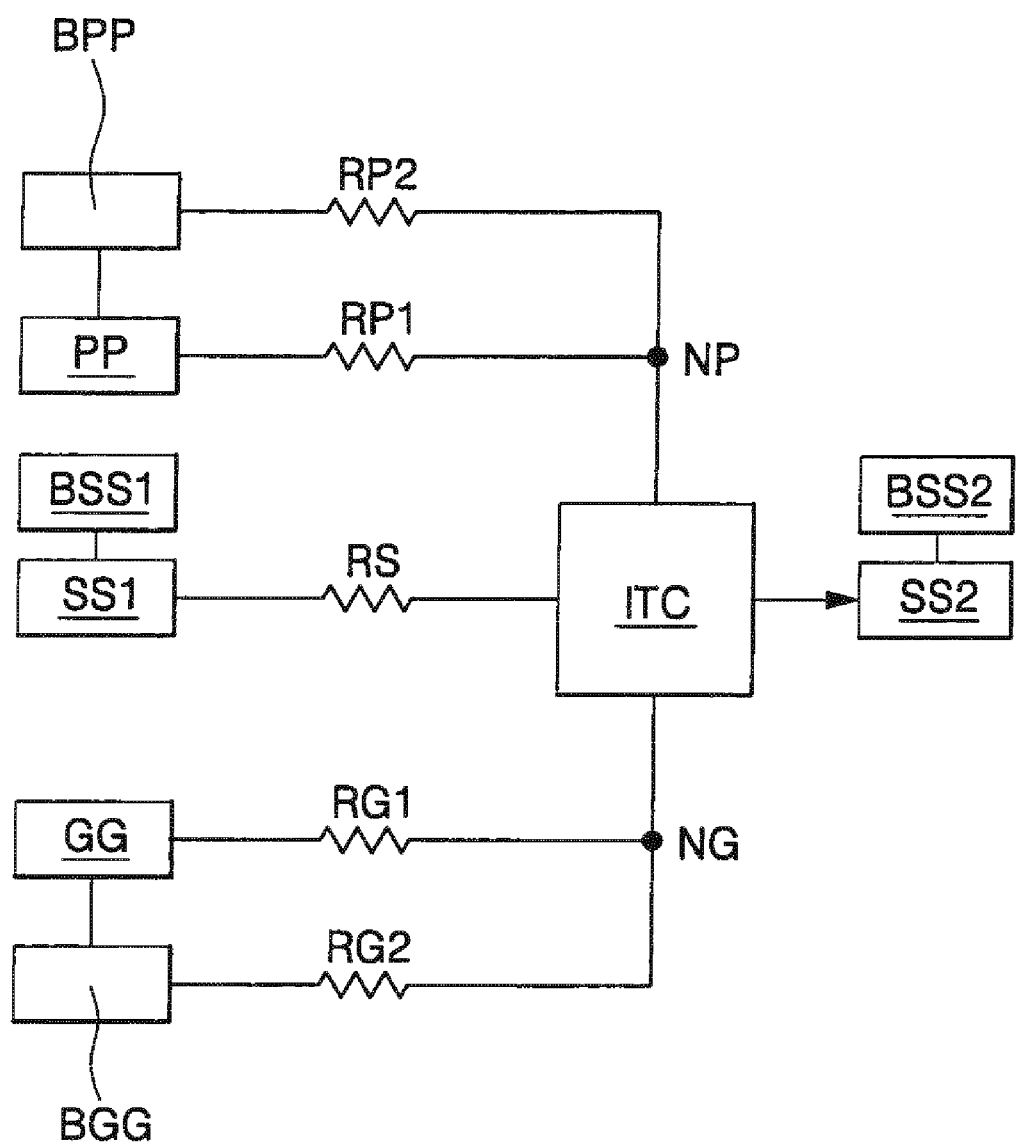
FIG. 8 is a schematic equivalent circuit diagram of semiconductor chips in accordance with embodiments of the present invention.

FIG. 8 is a schematic equivalent circuit diagram of a semiconductor chip in accordance with embodiments of the present invention.

Referring to FIG. 8, a power terminal NP of an internal circuit ITC of the semiconductor chips in accordance with some embodiments of the present invention is electrically connected to a power chip pad PP (5PP in FIG. 1, 25PP in FIG. 3, or 55PP in FIG. 5) through internal power lines (5PL' and 5PL" in FIG. 1, 25PL' and 25PL" in FIG. 3, or 55PL in FIG. 5) corresponding to a first power resistor RP1. In addition, the power terminal NP of the internal circuit ITC is electrically connected to a redistributed power line (18PL in FIG. 1, 31PL in FIG. 3, or 65PL in FIG. 5) corresponding to a second power resistor RP2, and the redistributed power line 18PL, 31PL, or 65PL is electrically connected to the power chip pad PP (5PP, 25PP, or 55PP). The redistributed power line 18PL, 31PL, or 65PL includes a power bonding pad BPP (18PP in FIG. 2A, 31PP in FIG. 4, or 65PP in FIG. 6) to which an external power voltage is applied. Consequently, the first power resistor RP1 and the second power resistor RP2 are connected in parallel to each other between the power bonding pad BPP and the power terminal NP. Therefore, when an external power voltage is applied to the power bonding pad BPP, the external power voltage is supplied to the power terminal NP through the first and second power resistors RP1 and RP2 which are connected in parallel. The second power resistor RP2 is a metal layer such as a copper layer having a low resistivity and a large plane area, as described above. Therefore, the second power resistor RP2 may exhibit remarkably low electrical resistance as compared to the first power resistor RP1. As a result, a stable power voltage can be supplied to the power terminal NP of the internal circuit ITC due to the presence of the second power resistor RP2.

Similarly, a ground terminal NG of an internal circuit ITC of semiconductor chips in accordance with some embodiments of the present invention is electrically connected to a ground chip pad GG (5GG in FIG. 1, 25GG in FIG. 3, or 55GG in FIG. 5) through internal ground lines (5GL' and 5GL" in FIG. 1, 25GL in FIG. 3, or 55GL in FIG. 5) corresponding to a first ground resistor RG1. In addition, the ground terminal NG of the internal circuit ITC is electrically connected to a redistributed ground line (18GL in FIG. 1, 31GL in FIG. 3, or 65GL in FIG. 5) corresponding to a second ground resistor RG2, and the redistributed ground line 18GL, 31GL, or 65GL is electrically connected to the ground chip pad GG (5GG, 25GG, or 55GG). The redistributed ground line 18GL, 31GL, or 65GL includes a ground bonding pad BGG (18GG in FIG. 2A, 31GG in FIG. 4, or 65GG in FIG. 6) to which an external ground voltage is applied. Consequently, the first ground resistor RG1 and the second ground resistor RG2 are connected in parallel to each other between the ground bonding pad BGG and the ground terminal NG. Therefore, when an external ground voltage is applied to the ground bonding pad BGG, the external ground voltage is supplied to the ground terminal NG through the first and second ground resistors RGl and RG2, which are connected in parallel. The second ground resistor RG2 is a metal layer such as a copper layer having a low resistivity and a large plane area, as described above. Therefore, the second ground resistor RG2 may have remarkably low electrical resistance as compared to the first ground resistor RG1. As a result, a stable ground voltage can be supplied to the ground terminal NG of the internal circuit ITC due to the presence of the second ground resistor RG2.

An input terminal of the internal circuit ITC is electrically connected to a first signal chip pad SS1 (5SS in FIG. 1) through an internal signal line (5SL in FIG. 1) corresponding to a signal resistor RS, and the first signal chip pad SS1 is electrically connected to a redistributed signal line (18SL in FIG. 1). The redistributed signal line 18SL includes a first signal bonding pad BSS1 (18SS in FIG. 2C) to which an external signal is applied. Therefore, when a first input signal is applied to the first signal bonding pad BSS1, the first input signal can be supplied to the input terminal of the internal circuit ITC through the redistributed signal line 18SL, the first signal chip pad SS1 and the internal signal line RS. Further, an output terminal of the internal circuit ITC is electrically connected to a second signal chip pad SS2, and the second signal chip pad SS2 is electrically connected to another redistributed signal line. The other redistributed signal line includes a second signal bonding pad BSS2. Therefore, an output signal of the internal circuit ITC can be output through the second signal chip pad SS2 and the second signal bonding pad BSS2.

Hereinafter, methods of fabricating semiconductor chips in accordance with exemplary embodiments of the present invention will be described.

Figure 9C:
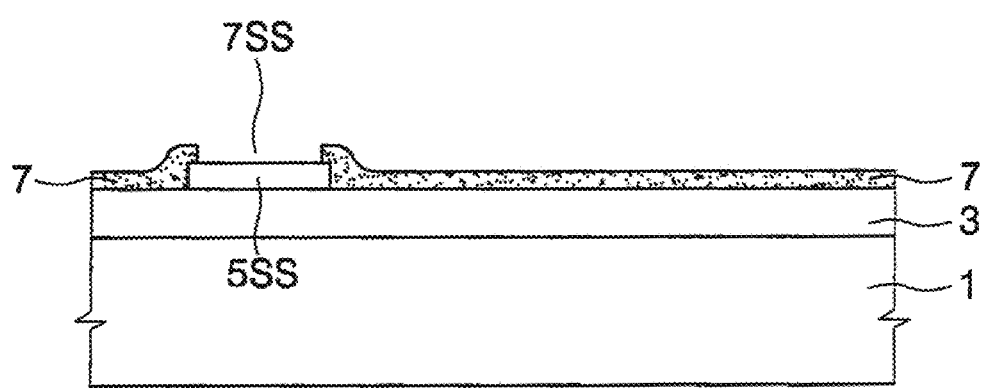
FIGS. 9C, 10C, and 11C are cross-sectional views taken along line III-III' of FIG. 1 to illustrate methods of fabricating a semiconductor chip in accordance with an embodiment of the present invention.
Figure 10A:
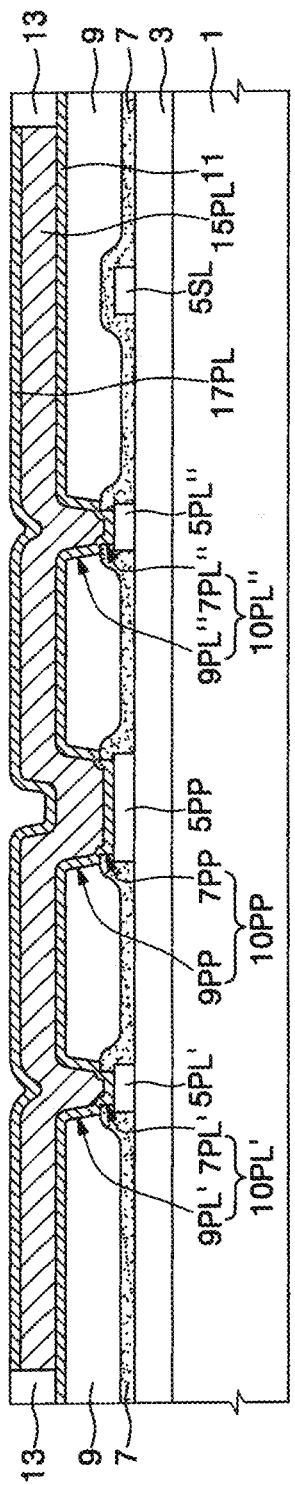
Figure 10B:
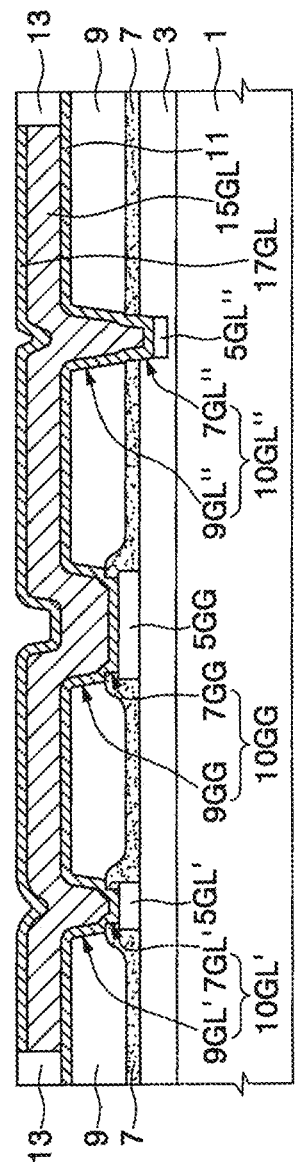
Figure 10C:
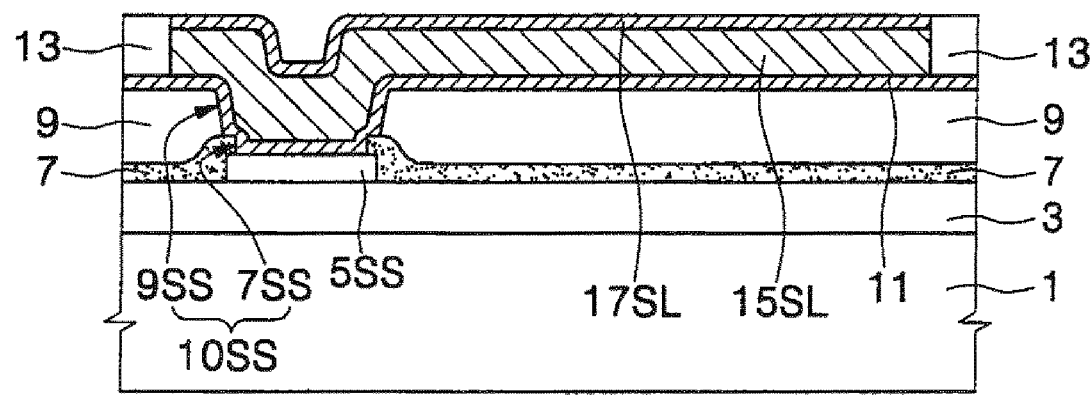
Figure 11C:
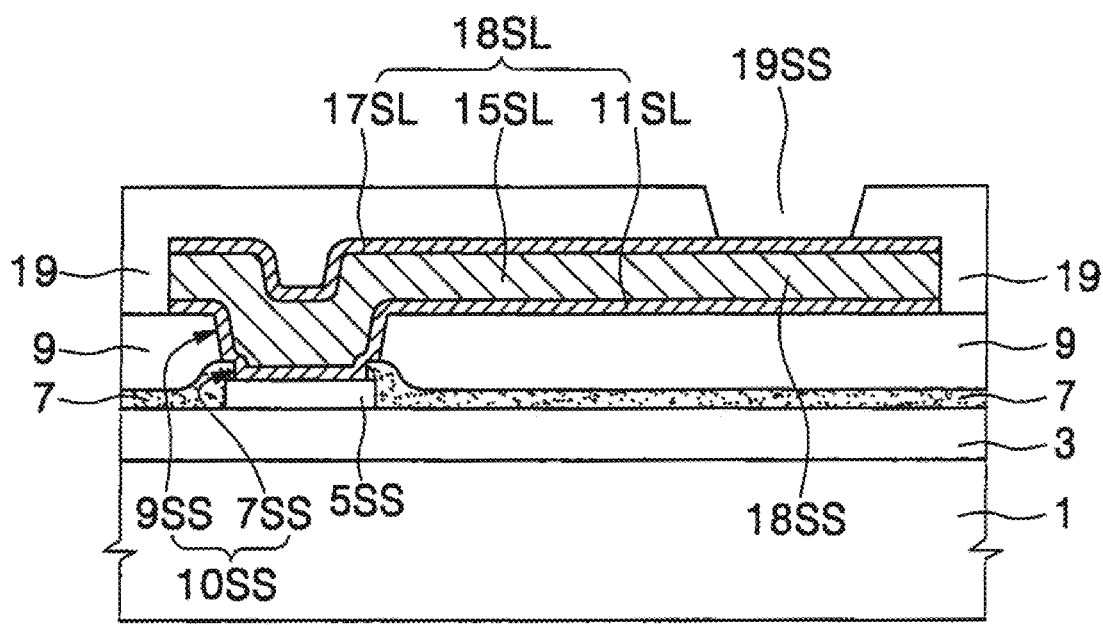

FIGS. 9A, 10A, and 11A are cross-sectional views taken along line I-I' of FIG. 1 to illustrate methods of fabricating a semiconductor chip in accordance with an embodiment of the present invention, and FIGS. 9B, 10B, and 11B are cross-sectional views taken along line II-II' of FIG. 1 to illustrate methods of fabricating a semiconductor chip in accordance with an embodiment of the present invention. In addition, FIGS. 9C, 10C, and 11C are cross-sectional views taken along line III-III' of FIG. 1 to illustrate methods of fabricating a semiconductor chip in accordance with an embodiment of the present invention.

Referring to FIGS. 9A, 9B, and 9C, an internal circuit (not shown) is formed on a semiconductor substrate 1. The internal circuit may include memory cells of a semiconductor memory device and a peripheral circuit for driving the memory cells. The memory cells may be formed in a plurality of cell array regions, for example, in first to fourth cell array regions (C1, C2, C3, and C4 in FIG. 1). The semiconductor memory device may be a DRAM device. In this case, a plurality of DRAM cells may be two-dimensionally arrayed in the first to fourth cell array regions C1, C2, C3, and C4. Alternatively, the internal circuit may be a non-memory semiconductor device.

An interlayer insulating layer 3 is formed on the substrate 1 having the internal circuit. The interlayer insulating layer 3 may be formed of an oxide layer such as a silicon oxide layer. A metal layer is formed on the interlayer insulating layer 3, and the metal layer is then patterned to form internal interconnections electrically connected to the internal circuit and chip pads electrically connected to the internal interconnections. The internal interconnections may include first and second internal power lines 5PL' and 5PL", first and second internal ground lines 5GL' and 5GL", and an internal signal line 5SL. The internal power lines 5PL' and 5PL" are electrically connected to a power terminal of the internal circuit, and the internal ground lines 5GL' and 5GL" are electrically connected to a ground terminal of the internal circuit. In addition, the internal signal line 5SL is electrically connected to an input terminal or an output terminal of the internal circuit.

The chip pads may include a power chip pad 5PP, a ground chip pad 5GG, and a signal chip pad 5SS. The power chip pad 5PP is electrically connected to the power terminal of the internal circuit through the internal power lines 5PL' and 5PL", and the ground chip pad 5GG is electrically connected to the ground terminal of the internal circuit through the internal ground lines 5GL' and 5GL". In addition, the signal chip pad 5SS is electrically connected to the input terminal or the output terminal of the internal circuit through the internal signal line 5SL.

At least one of the internal interconnections may be formed in or under the interlayer insulating layer 3. For example, the second internal ground line 5GL" may be formed in the interlayer insulating layer 3, as shown in FIG. 9B. In this case, the second internal ground line 5GL" may be formed of a conductive layer different from the chip pads 5PP, 5GG, and 5SS, the internal power lines 5PL' and 5PL", the first internal ground line 5GL', and the internal signal line 5SL.

A passivation layer 7 is formed over the chip pads 5PP, 5GG and 5SS and the internal interconnections 5PL', 5PL", 5GL', 5GL", and 5SL. The passivation layer 7 may be formed by sequentially stacking, for example, a silicon oxide layer and a silicon nitride layer. The passivation layer 7 and the interlayer insulating layer 3 are patterned to form a lower power chip pad opening 7PP, a lower ground chip pad opening 7GG, and a lower signal chip pad opening 7SS, which expose the chip pads 5PP, 5GG, and 5SS, respectively. First and second lower power via-holes 7PL' and 7PL" as well as first and second lower ground via-holes 7GL' and 7GL" may also be formed to respectively expose the internal power lines 5PL' and 5PL" as well as the internal ground lines 5GL' and 5GL" during formation of the lower chip pad openings 7PP, 7GG, and 7SS.

Referring to FIGS. 10A, 10B, and 10C, a first dielectric layer 9 is formed on the substrate 1 having the lower chip pad openings 7PP, 7GG, and 7SS and the lower via-holes 7PL', 7PL", 7GL', and 7GL". The first dielectric layer 9 may be formed of an insulating material having a lower dielectric constant than that of the interlayer insulating layer 3. In addition, the first dielectric layer 9 may be formed to a thickness greater than that of the interlayer insulating layer 3. The first dielectric layer 9 may be formed of a polymer layer such as a polyimide layer or a photosensitive polyimide layer. Alternatively, the first dielectric layer 9 may be formed of an oxide layer such as a silicon oxide layer.

The first dielectric layer 9 is patterned to form an upper power chip pad opening 9PP, an upper ground chip pad opening 9GG, and an upper signal chip pad opening 9SS, which expose the chip pads 5PP, 5GG, and 5SS, respectively. An upper via-hole may be formed to expose at least one of the internal power lines 5PL' and 5PL" and the internal ground lines 5GL' and 5GL" during formation of the upper chip pad openings 9PP, 9GG, and 9SS. In the present embodiment, during formation of the upper chip pad openings 9PP, 9GG, and 9SS, first and second upper power via-holes 9PL' and 9PL" and first and second upper ground via-holes 9GL' and 9GL" may be formed to expose the internal power lines 5PL' and 5PL" and the internal ground lines 5GL' and 5GL", respectively.

When the first dielectric layer 9 is formed of a polyimide layer, the first dielectric layer 9 may be patterned using conventional photolithography and etching processes. Alternatively, when the first dielectric layer 9 is formed of a photosensitive polyimide layer, the first dielectric layer 9 may be patterned using only a photolithography process without using an etching process.

The first lower power via-hole 7PL' and the first upper power via-hole 9PL' constitute a first power via-hole 10PL', and the second lower power via-hole 7PL" and the second upper power via-hole 9PL" constitute a second power via-hole 10PL". In addition, the first lower ground via-hole 7GL' and the first upper ground via-hole 9GL' constitute a first ground via-hole 10GL', and the second lower ground via-hole 7GL" and the second upper ground via-hole 9GL" constitute a second ground via-hole 10GL". Further, the lower power chip pad opening 7PP and the upper power chip pad opening 9PP constitute a power chip pad opening 10PP, and the lower ground chip pad opening 7GG and the upper ground chip pad opening 9GG constitute a ground chip pad opening 10GG. Furthermore, the lower signal chip pad opening 7SS and the upper signal chip pad opening 9SS constitute a signal chip pad opening 10SS.

A seed metal layer 11 is formed on the substrate 1 having the via-holes 10PL', 10PL", 10GL', and 10GL" and the chip pad openings 10PP, 10GG, and 10SS. The seed metal layer 11 may be formed by sequentially stacking a wetting metal layer and a copper layer. The wetting metal layer improves adhesion between the copper layer and the first dielectric layer 9. The wetting metal layer may be formed of a titanium layer or a chrome layer. The seed metal layer 11 may be formed using a sputtering technique.

A sacrificial layer pattern 13 is formed on the seed metal layer 11. The sacrificial layer pattern 13 may be formed of an insulating material pattern such as a photoresist pattern. The sacrificial layer pattern 13 may define first to third groove regions spaced apart from one another on the seed metal layer 11. The first groove region exposes the power chip pad opening 10PP and the power via-holes 10PL' and 10PL" as well as the seed metal layer 11 disposed therebetween, and the second groove region exposes the ground chip pad opening 10GG and the ground via-holes 10GL' and 10GL" as well as the seed metal layer 11 disposed therebetween. In addition, the third groove region exposes at least the signal chip pad opening 10SS.

Main metal patterns are formed on the exposed seed metal layer 11 using an electroplating method. That is, first to third main metal patterns are formed in the first to third grooves, respectively. The main metal patterns may be formed of a metal layer having a low resistivity. For example, the main metal patterns may be formed by sequentially plating a main metal layer and a cladding layer. The cladding layer may be formed by sequentially plating a diffusion barrier layer and a gold layer. The diffusion barrier layer is formed of a metal layer for suppressing interaction between the main metal layer and the gold layer, and the gold layer is formed to improve adhesion of a bonding wire during a subsequent bonding process. The main metal layer may be formed of a copper layer having a low resistivity, and the diffusion barrier layer may be formed of a nickel layer. As a result, a first main metal pattern 15PL and a first cladding layer pattern 17PL, which are sequentially stacked, may be formed on the seed metal layer 11 in the first groove region. A second main metal pattern 15GL and a second cladding layer pattern 17GL, which are sequentially stacked, may be formed on the seed metal layer 11 in the second groove region. In addition, a third main metal pattern 15SL and a third cladding layer pattern 17SL, which are sequentially stacked, may be formed on the seed metal layer 11 in the third groove region.

Referring to FIGS. 11A, 11B, and 11C, the sacrificial layer pattern 13 is removed to expose the seed metal layer 11 thereunder. The exposed seed metal layer 11 is selectively etched to expose the first dielectric layer 9 thereunder. As a result, first to third seed metal patterns 11PL, 11GL, and 11SL remain under the first to third main metal patterns 15PL, 15GL, and 15SL, respectively. The first seed metal pattern 11PL, the first main metal pattern 15PL and the first cladding layer pattern 17PL constitute a redistributed power line 18PL. The second seed metal pattern 11GL, the second main metal pattern 15GL, and the second cladding layer pattern 17GL constitute a redistributed ground line 18GL. In addition, the third seed metal pattern 11SL, the third main metal pattern 15SL, and the third cladding layer pattern 17SL constitute a redistributed signal line 18SL.

Consequently, the redistributed power line 18PL is formed to directly connect the internal power lines 5PL' and 5PL" to the power chip pad 5PP, and the redistributed ground line 18GL is formed to directly connect the internal ground lines 5GL' and 5GL" to the ground chip pad 5GG. In addition, the redistributed signal line 18SL is electrically connected to the signal chip pad 5SS. The redistributed power line 18PL, the redistributed ground line 18GL, and the redistributed signal line 18SL may have a plane shape or a mesh shape, when viewed from a plan view.

A second dielectric layer 19 is formed on the substrate 1 having the redistributed metal interconnections 18PL, 18GL, and 18SL. The second dielectric layer 19 may be formed of the same material layer as the first dielectric layer 9. The second dielectric layer 19 is patterned to form a power bonding pad opening 19PP, a ground bonding pad opening 19GG, and a signal bonding pad opening 19SS, which expose the redistributed metal interconnections 18PL, 18GL, and 18SL, respectively. As a result, the power bonding pad opening 19PP defines a power bonding pad 18PP, and the ground bonding pad opening 19GG defines a ground bonding pad 18GG. In addition, the signal bonding pad opening 19SS defines a signal bonding pad 18SS. The bonding pad openings 19PP, 19GG, and 19SS may be formed spaced apart from the chip pads 5PP, 5GG, and 5SS, respectively, as shown in FIGS. 11A, 11B, and 11C. Alternatively, bonding pad openings 19PP, 19GG and 19SS may be formed to overlap the chip pads 5PP, 5GG, and 5SS, respectively, when viewed from a plan view.

The semiconductor chips shown in FIGS. 3 and 4 may be manufactured using the same or similar method as the embodiment described with reference to FIGS. 9A to 11A, 9B to 11B, and 9C to 11C. Therefore, methods of manufacturing the semiconductor chips shown in FIGS. 3 and 4 will not be described.

FIGS. 12 to 15 are cross-sectional views taken along line V-V' of FIG. 5 to illustrate methods of fabricating a semiconductor chip in accordance with another embodiment of the present invention.

Figure 12:
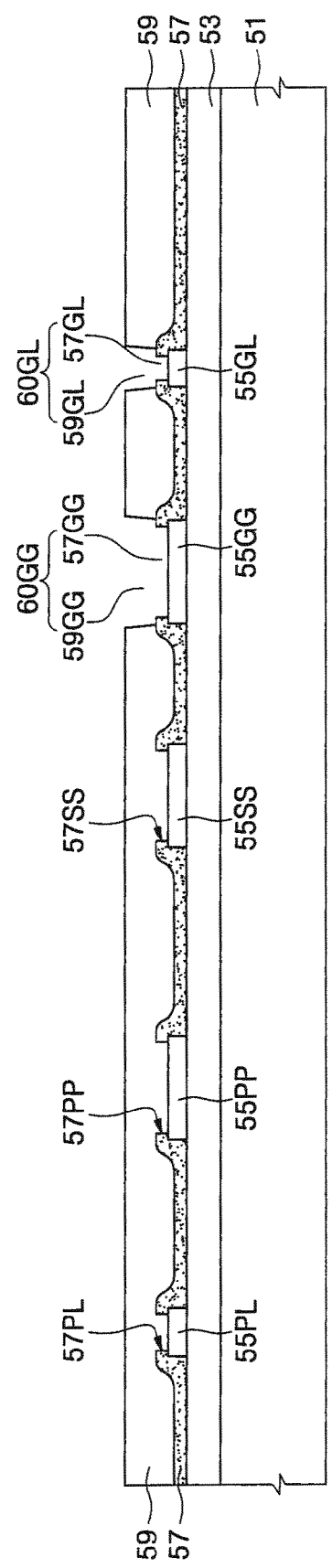
FIGS. 12 to 15 are cross-sectional views taken along line V-V' of FIG. 5 to illustrate methods of fabricating a semiconductor chip in accordance with another embodiment of the present invention.

Referring to FIG. 12, an internal circuit (not shown) is formed on a semiconductor substrate 51. The internal circuit may be formed using the same method as described with reference to FIGS. 9A, 9B, and 9C. An interlayer insulating layer 53 is formed on the substrate 51 having the internal circuit. Chip pads and internal interconnections are formed on the interlayer insulating layer 53. The internal interconnections may include first and second internal power supply lines 55GL and 55PL electrically connected to a first power supply terminal and a second power supply terminal of the internal circuit, respectively. In addition, the internal interconnections may further include at least one internal signal line (not shown) electrically connected to an input or output terminal of the internal circuit. The chip pads may include first and second power supply chip pads 55GG and 55PP electrically connected to the first and second internal power supply lines 55GL and 55PL, respectively.

The first and second internal power supply lines 55GL and 55PL may be an internal ground line and an internal power line, respectively. In this case, the first and second power supply chip pads 55GG and 55PP may be a ground chip pad and a power chip pad, respectively. On the contrary, the first and second internal power supply lines 55GL and 55PL may be an internal power line and an internal ground line, respectively. In this case, the first and second power supply chip pads 55GG and 55PP may be a power chip pad and a ground chip pad, respectively.

The internal power supply lines 55GL and 55PL may be formed using the same method as described with reference to FIGS. 9A, 9B, and 9C. That is, at least one of the internal power supply lines 55PL and 55GL may be formed in or under the interlayer insulating layer 53.

A passivation layer 57 is formed on the substrate 51 having the power supply chip pads 55GG and 55PP, the signal chip pad 55SS, and the internal power supply lines 55GL and 55PL. The passivation layer 57 is patterned to form a first lower power supply chip pad opening 57GG, a second lower power supply chip pad opening 57PP, a lower signal chip pad opening 57SS, a first lower via-hole 57GL and a second lower via-hole 57PL which expose the power supply chip pads 55GG and 55PP, the signal chip pad 55SS and the internal power supply lines 55GL and 55PL, respectively.

A first lower dielectric layer 59 is formed on the substrate 51 having the lower power supply chip pad openings 57GG and 57PP, the lower signal chip pad opening 57SS, and the lower via-holes 57GL and 57PL. The first lower dielectric layer 59 may be formed of the same material layer as the first dielectric layer 9 of FIGS. 10A, 10B, and 10C. The first lower dielectric layer 59 is patterned to form a first upper power supply chip pad opening 59GG and a first upper via-hole 59GL, which expose the first power supply chip pad 55GG and the first internal power supply line 55GL, respectively. The first lower power supply chip pad opening 57GG and the first upper power supply chip pad opening 59GG constitute a first power supply chip pad opening 60GG, and the first lower via-hole 57GL and the first upper via-hole 59GL constitute a first via-hole 60GL.

Figure 13:
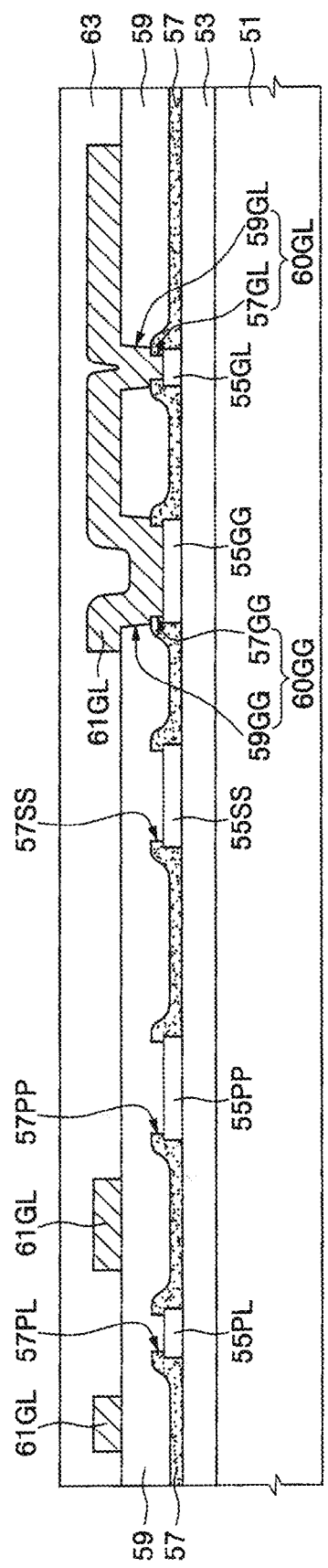

Referring to FIG. 13, a first redistributed power supply line 61GL is formed on the first lower dielectric layer 59. The first redistributed power supply line 61GL is formed to directly connect the first internal power supply line 55GL to the first power supply chip pad 55GG through the first via-hole 60GL and the first power supply chip pad opening 60GG, respectively. The first redistributed power supply line 61GL may be fabricated using the method of forming the redistributed metal interconnections 18PL, 18GL, and 18SL described with reference to FIGS. 10A, 10B, 10C, 11A, 11B, and 11C. In addition, the first redistributed power supply line 61GL may be formed to have a plane shape or a mesh shape, when viewed from a plan view.

A first upper dielectric layer 63 is formed over the first redistributed power supply line 61GL. The first upper dielectric layer 63 may also be formed of the same material layer as the first dielectric layer 9 described with reference to FIGS. 10A, 10B, and 10C.

Figure 14:
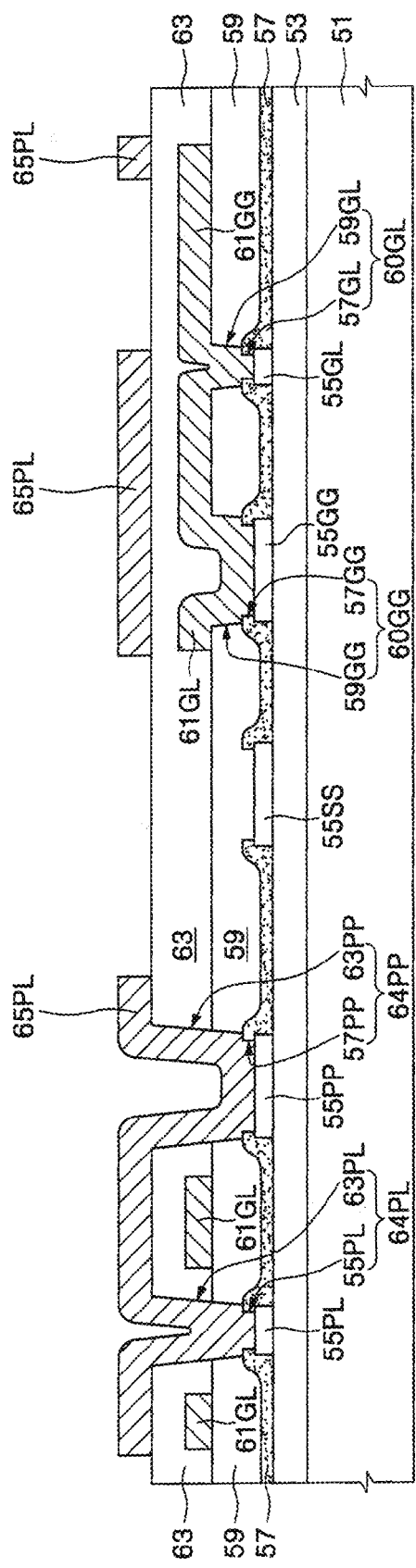

Referring to FIG. 14, the first upper/lower dielectric layers 63 and 59 are patterned to form a second upper power supply chip pad opening 63PP and a second upper via-hole 63PL which expose the second power supply chip pad 55PP and the second internal power supply line 55PL, respectively. The second lower power supply chip pad opening 57PP and the second upper power supply chip pad opening 63PP constitute a second power supply chip pad opening 64PP, and the second lower via-hole 57PL and the second upper via-hole 63PL constitute a second via-hole 64PL.

A second redistributed power supply line 65PL is formed on the first upper dielectric layer 63. The second redistributed power supply line 65PL is formed to directly connect the second internal power supply line 55PL to the second power supply chip pad 55PP through the second via-hole 64PL and the second power supply chip pad opening 64PP, respectively. The second redistributed power supply line 65PL may be fabricated using the method of forming a first redistributed power supply line 61GL, i.e., an electroplating method. In addition, the second redistributed power supply line 65PL may be formed to have a plane shape or a mesh shape, when viewed from a plan view.

When the first and second power supply chip pads 55GG and 55PP correspond to a ground chip pad and a power chip pad respectively, the first and second redistributed power supply lines 61GL and 65PL may act as a redistributed ground line and a redistributed power line, respectively. On the contrary, when the first and second power supply chip pads 55GG and 55PP correspond to a power chip pad and a ground chip pad respectively, the first and second redistributed power supply lines 61GL and 65PL may act as a redistributed power line and a redistributed ground line, respectively.

In the present embodiments, at least a portion of the first redistributed power supply line 61GL may be formed to overlap at least a portion of the second redistributed power supply line 65PL, as shown in FIG. 14. In this case, power capacitance Cpg (see FIG. 6) may be provided between the first and second redistributed power supply lines 61GL and 65PL. The power capacitance Cpg can improve power noise immunity. Therefore, in order to improve the power noise immunity, an overlap area between the first and second redistributed power supply lines 61GL and 65PL is preferably increased.

Figure 15:
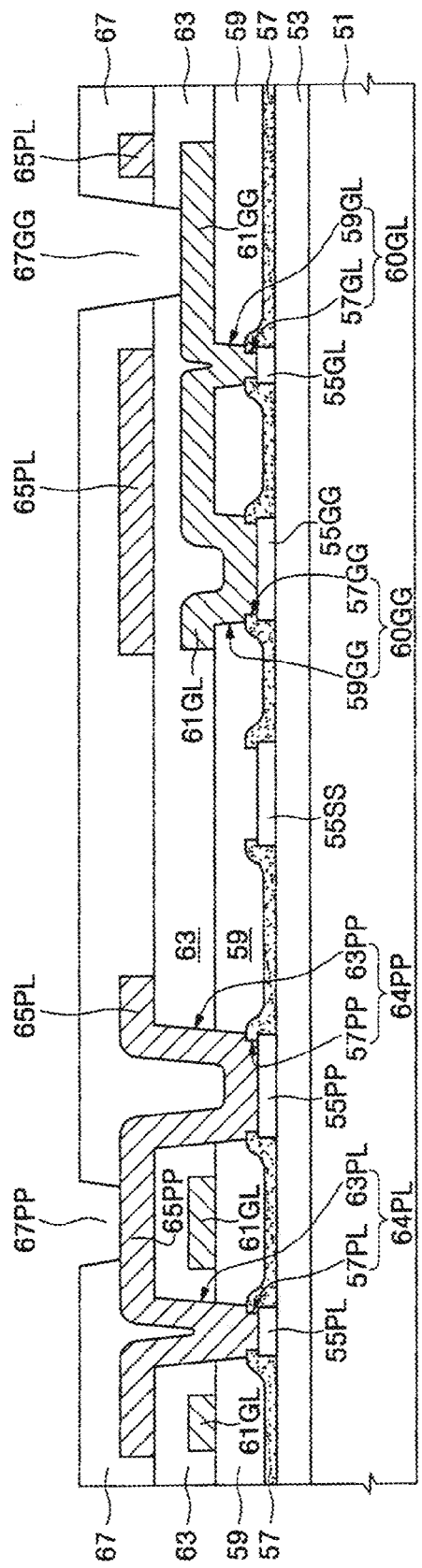

Referring to FIG. 15, a second dielectric layer 67 is formed on the substrate 51 having the second redistributed power supply line 65PL. The second dielectric layer 67 may be formed of a polymer layer such as a polyimide layer or a photosensitive polyimide layer. Alternatively, the second dielectric layer 67 may be formed of an oxide layer such as a silicon oxide layer. The first and second dielectric layers 63 and 67 are patterned to form a first bonding pad opening 67GG and a second bonding pad opening 67PP, which expose the first redistributed power supply line 61GL and the second redistributed power supply line 65PL, respectively. The first bonding pad opening 67GG defines a first bonding pad 61GG, and the second bonding pad opening 67PP defines a second bonding pad 65PP.

According to some embodiments of the present invention as described above, at least one redistributed power supply line is provided on a substrate having an internal circuit as well as an internal ground line and an internal power line, which are electrically connected to the internal circuit. The redistributed power supply line is directly connected to the internal ground line or the internal power line, thereby supplying stable power to the internal circuit through the redistributed power supply line.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A semiconductor chip comprising:
a semiconductor substrate having an internal circuit at an upper portion thereof;
an internal interconnection disposed on the semiconductor substrate and electrically connected to the internal circuit;
a chip pad disposed on the semiconductor substrate and electrically connected to the internal circuit by the internal interconnection;
a passivation layer extending over the substrate; and
a redistributed metal interconnection extending over the passivation layer, and wherein one portion of the redistributed metal interconnection passes through the passivation layer and is electrically conductively connected to the internal interconnection, and another portion of the redistributed metal interconnection passes through the passivation layer and is electrically conductively connected to the chip pad such that the internal interconnection and the chip pad are electrically connected to one another by the redistributed metal interconnection, wherein the internal connection and the chip pad are formed at a same level relative to a surface of the semiconductor substrate.

2. The semiconductor chip according to claim 1, wherein the internal circuit comprises at least one of memory cells and a peripheral circuit of a semiconductor memory device.

3. The semiconductor chip according to claim 1, wherein the chip pad is a power chip pad, and the internal interconnection is an internal power line which supplies a power voltage to the internal circuit.

4. The semiconductor chip according to claim 1, wherein the chip pad is a ground chip pad, and the internal interconnection is an internal ground line which supplies a ground voltage to the internal circuit.

5. The semiconductor chip according to claim 1, wherein the passivation layer comprises a silicon oxide layer and a silicon nitride layer, which are stacked one atop the other.

6. The semiconductor chip according to claim 1, further comprising a first dielectric layer between the passivation layer and the redistributed metal interconnection, wherein the redistributed metal interconnection also passes through the first dielectric layer at respective locations into electrically conductive contact with the chip pad and the internal interconnection.

7. The semiconductor chip according to claim 6, wherein the first dielectric layer includes at least one of a polymer layer and a silicon oxide layer.

8. The semiconductor chip according to claim 7, wherein the polymer layer includes at least one of a polyimide layer and a photosensitive polyimide layer.

9. The semiconductor chip according to claim 1, wherein the redistributed metal interconnection comprises a copper layer.

10. The semiconductor chip according to claim 6, further comprising a second dielectric layer covering the passivation layer and the redistributed metal interconnection extending therealong wherein the second dielectric layer has a bonding pad opening therethrough that exposes a bonding pad contiguous with the redistributed metal interconnection.

11. The semiconductor chip according to claim 10, wherein the second dielectric layer includes at least one of a polymer layer and a silicon oxide layer.

12. The semiconductor chip according to claim 11, wherein the polymer layer includes at least one of a polyimide layer and a photosensitive polyimide layer.

13. A semiconductor chip comprising:
an internal circuit formed on a semiconductor substrate;
a chip pad and an internal interconnection each disposed on the semiconductor substrate as spaced apart from each other, the chip pad being electrically connected to the internal circuit by the internal interconnection;
a passivation layer extending over the substrate, the passivation layer having a chip-pad opening and a via-hole therethrough aligned with the chip pad and the internal interconnection, respectively; and
a redistributed metal interconnection extending over the passivation layer and also over the chip pad and the internal interconnection, and
wherein the redistributed metal interconnection is electrically connected to the internal interconnection and to the chip pad through the via-hole and the chip pad opening, respectively, and
wherein the internal connection and the chip pad are formed at a same level relative to a surface of the semiconductor substrate.

14. The semiconductor chip of claim 13, further comprising an interlayer insulating layer over the internal circuit.

15. The semiconductor chip of claim 14, wherein the internal interconnection comprises at least one internal power line and at least one internal ground line, and wherein at least one of the internal power line and the internal ground line runs within the interlayer insulating layer.

16. The semiconductor chip of claim 14, wherein the internal interconnection comprises at least one internal power line and at least one internal ground line, and wherein at least one of the internal power line and the internal ground line runs under the interlayer insulating layer.

17. The semiconductor chip of claim 14, further comprising a first dielectric layer between the passivation layer and the redistributed metal interconnection, wherein the first dielectric layer is substantially thicker than the interlayer insulating layer.

18. The semiconductor chip of claim 13, wherein the via-hole comprises a plurality of sub via-holes that are one-dimensionally arrayed.

19. The semiconductor chip of claim 13, wherein the chip pad is of material different from the material of the internal interconnection.

20. The semiconductor chip of claim 13, further comprising further comprising a first dielectric layer on the passivation layer, a second dielectric layer, and a bonding pad contiguous with the redistributed metal interconnection, and
wherein the internal circuit at the upper portion of the semiconductor substrate has a terminal at which the internal connection is electrically connected to the circuit, the redistributed metal line is electrically connected to the terminal of the internal circuit through the internal connection, a portion of the first dielectric layer is covered by the redistributed metal interconnection, the second dielectric layer covers the redistributed metal interconnection, and the second dielectric layer has a bonding pad opening therethrough that exposes the bonding pad, such that the redistributed metal interconnection and the internal interconnection are electrically connected in parallel between the bonding pad and the terminal of the internal circuit.

21. A semiconductor chip comprising:
an internal circuit formed on a semiconductor substrate;
a chip pad and an internal interconnection each disposed on the semiconductor substrate as spaced apart from each other, the chip pad being electrically connected to the internal circuit by the internal interconnection;
a passivation layer extending over the substrate, the passivation layer having a chip-pad opening and a via-hole therethrough aligned with the chip pad and the internal interconnection, respectively; and
a redistributed metal interconnection extending over the passivation layer and also over the chip pad and the internal interconnection, and
wherein the redistributed metal interconnection is electrically connected to the internal interconnection and to the chip pad through the via-hole and the chip pad opening, respectively, and
wherein the chip pad is formed at a higher level than the internal interconnection relative to a surface of the semiconductor substrate.

* * * * *